(12) United States Patent
Argollo et al.

(10) Patent No.: US 10,114,916 B1
(45) Date of Patent: Oct. 30, 2018

(54) METHOD AND SYSTEM TO ACCELERATE VISUALIZATION OF WAVEFORM DATA

(71) Applicant: Cadence Design Systems, Inc., San Jose, CA (US)

(72) Inventors: Daniel da Fonseca Munford Argollo, Santa Clara, CA (US); Ankur Duggal, Noida (IN); Iain G. Farquharson, Sunnyvale, CA (US); Hongzhou Liu, Sewickley, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/198,864

(22) Filed: Jun. 30, 2016

(51) Int. Cl.
| | |
|---|---|
| *G06F 17/50* | (2006.01) |
| *G06F 17/30* | (2006.01) |
| *G06T 11/20* | (2006.01) |
| *G06F 3/0489* | (2013.01) |
| *G06F 11/32* | (2006.01) |

(52) U.S. Cl.
CPC ...... *G06F 17/504* (2013.01); *G06F 17/30115* (2013.01); *G06F 17/30572* (2013.01); *G06F 17/5081* (2013.01); *G06T 11/20* (2013.01); *G06F 3/04897* (2013.01); *G06F 11/322* (2013.01); *G06F 17/5009* (2013.01); *G06F 17/5022* (2013.01); *G06T 11/206* (2013.01)

(58) Field of Classification Search
CPC .............. G06F 17/5009; G06F 17/504; G06F 17/5022; G06F 17/5081; G06F 11/322; G06F 17/30115; G06F 17/30572; G06F 3/04897; G06T 11/206; G06T 11/20
See application file for complete search history.

(56) References Cited

U.S. PATENT DOCUMENTS

| | | | |
|---|---|---|---|
| 4,115,863 A | 9/1978 | Brown | |
| 4,481,605 A | 11/1984 | Pierce | |
| 5,043,920 A * | 8/1991 | Malm | G06F 3/0489 345/419 |
| 5,151,984 A * | 9/1992 | Newman | G06F 17/5009 703/22 |
| 5,528,356 A * | 6/1996 | Harcourt | G01M 11/3136 356/73.1 |
| 5,731,984 A * | 3/1998 | Ullmann | G01R 31/31912 702/108 |
| 5,764,872 A | 6/1998 | Koyamada et al. | |

(Continued)

OTHER PUBLICATIONS

Non-Final Office Action dated Aug. 7, 2017 for U.S. Appl. No. 14/981,488.

(Continued)

*Primary Examiner* — Helen Rossoshek
(74) *Attorney, Agent, or Firm* — Vista IP Law Group, LLP

(57) ABSTRACT

An improved approach is provided to provide fast access to waveform visualizations for electronic designs. Data reduction is performed on the waveform data, where the quantity of the waveform data is reduced in an intelligent manner, such that the reduced waveform data still retains sufficient data fidelity for accurate data analysis and waveform visualization. The reduced data can then be displayed in an accelerated manner. From the display of the reduced data, this allows the user to select only the specific one or more waveforms for which the user seeks viewing of the full waveform data.

21 Claims, 36 Drawing Sheets

(56) References Cited

U.S. PATENT DOCUMENTS

| | | | |
|---|---|---|---|
| 5,838,949 A * | 11/1998 | Hassoun | G06F 17/5022 |
| | | | 703/13 |
| 6,229,536 B1 | 5/2001 | Alexander | |
| 6,664,913 B1 | 12/2003 | Craven | |
| 6,909,415 B2 * | 6/2005 | Kumagawa | G02F 1/136213 |
| | | | 345/204 |
| 6,938,060 B2 | 8/2005 | Good et al. | |
| 7,102,068 B2 * | 9/2006 | Kitayama | G10H 1/057 |
| | | | 84/606 |
| 7,126,968 B2 * | 10/2006 | Shinohara | H03M 7/30 |
| | | | 370/521 |
| 7,551,777 B1 | 6/2009 | Pichumani | |
| 8,325,188 B1 * | 12/2012 | Phillips | G06T 11/206 |
| | | | 345/428 |
| 2002/0093841 A1 | 7/2002 | Kitayama | |
| 2002/0178006 A1 | 11/2002 | Suzuki | |
| 2004/0243372 A1 * | 12/2004 | Tester | G06F 17/5022 |
| | | | 703/14 |
| 2007/0217694 A1 | 9/2007 | Sullivan | |
| 2007/0236480 A1 | 10/2007 | Sullivan | |
| 2009/0225083 A1 | 9/2009 | Thomas | |
| 2012/0036171 A1 | 2/2012 | Rindner | |
| 2012/0046931 A1 | 2/2012 | Takahashi | |

OTHER PUBLICATIONS

Non-Final Office Action dated Apr. 5, 2018 for U.S. Appl. No. 14/981,488.

Final Office Action dated Dec. 11, 2017 for U.S. Appl. No. 14/981,488.

\* cited by examiner

METHOD AND SYSTEM TO ACCELERATE VISUALIZATION OF WAVEFORM DATA

FIELD

This disclosure relates to the field of electrical design and verification.

BACKGROUND

Modern electronic design is typically performed with computer aided design (CAD) tools or electronic design automation (EDA) systems. To design a circuit, such as an integrated circuit (IC), a designer first creates high level behavior descriptions of the IC device using a high-level hardware design language (HDL). An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design of a layout and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product.

For example, SPICE and FASTSPICE are common types of simulators that perform simulation to verify the operation of an electronic design. With these types of tools, the electronic design is converted into a system of equation(s), which is then solved for a given set of inputs to check the state of specific portions of the circuit at given points in time.

A significant portion of the data pertaining to the simulation activities may be waveform data. In many cases, the waveform is the output data that results from performing simulation on analog or analog/mixed signal designs. For example, a given circuit design may receive a set of stimulus data, where simulation of a model of that circuit design is performed using the stimulus to identify the resulting waveform pattern from expected operation of that design. In other cases, the waveform data is the input data that is fed into a circuit design for simulation.

The EDA tool may employ either a waveform viewing tool or a waveform editing tool to visually display waveform data onto the user interface of a user display apparatus. In many cases, these tools are operated in an interactive manner, where a user dynamically manipulates the tool to display the waveform data in real-time with a desired visual representation. For example, the user may manipulate the waveform tool to zoom into a specific portion of the waveform or to scroll across different portions of the waveform. This interactive manipulation permits the user to analyze the waveforms and to seek out anomalies that may indicate possible errors in the circuit design, by scanning through the data and zooming in at specific portions of the waveforms.

Under the covers, numerous computational operations may be performed to comply with the user's manipulation of the waveform tool. Such operations may involve loading the waveform data into memory, retrieving the specific data to be operated upon, performing graphical operations upon that data to generate display data as required by the user commands, and generation of the interface for display.

With interactive tools, it is desirable for these operations to be performed fast enough such that the user does not experience undue delays while the system renders the waveform for display on the display screen.

However, modern EDA tools are now generating massive quantities of waveform data, e.g., involving tens of millions of data objects for thousands of waveforms. This is because the modern design process often requires a large number of different testing parameters, such as different runtime-conditions/environmental parameters and process corners, which results in the large number of waveforms. Examples of runtime-conditions/environmental parameters include, e.g., temperatures, battery levels. A process corner refers to a variation of fabrication parameters used to manufacture the circuit design onto a semiconductor wafer. Process corners often represent the extremes of these parameter variations within which the circuit must function correctly, and the circuit running on devices fabricated at these process corners may run slower or faster than specified and/or at lower or higher temperatures and/or at different voltage levels. However, these corners need to be analyzed to check whether the circuit fails to function properly at any of these process extremes, to check if the design is considered to have inadequate design margins.

The problem is that when the user seeks to plot the waveform results in an interactive display with conventional tools, unreasonable levels of latency occur before the waveforms are actually visualized on a display device. This is due, in part, to the massive amount of data located in the massive number of files that are associated with the simulation results for the large numbers of corners, where all of the data is needed to plot the waveforms for the simulation. As a result, the user typically experiences an undue amounts of delay while the system plots the waveforms.

Therefore, there is a need for an improved approach to handle waveform data that that can adequately address these problems with the conventional tools.

SUMMARY

Embodiments of the invention provide an improved method, system, and computer program product to provide fast access to waveform visualizations by performing data reduction of waveform data. The quantity of the waveform data is reduced in an intelligent manner, where the reduced waveform data still retains sufficient data fidelity for accurate data analysis and waveform visualization. The reduced data can then be displayed in an accelerated manner. From the display of the reduced data, this allows the user to select only the specific one or more waveforms for which the user seeks viewing of the full waveform data, e.g., for outliers from the simulation results.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Embodiments of the invention provide an improved method, system, and computer program product to provide fast access to waveform visualizations by performing data reduction of waveform data. The quantity of the waveform data is reduced in an intelligent manner, where the reduced waveform data still retains sufficient data fidelity for accurate data analysis and waveform visualization. The reduced data can then be displayed in an accelerated manner.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
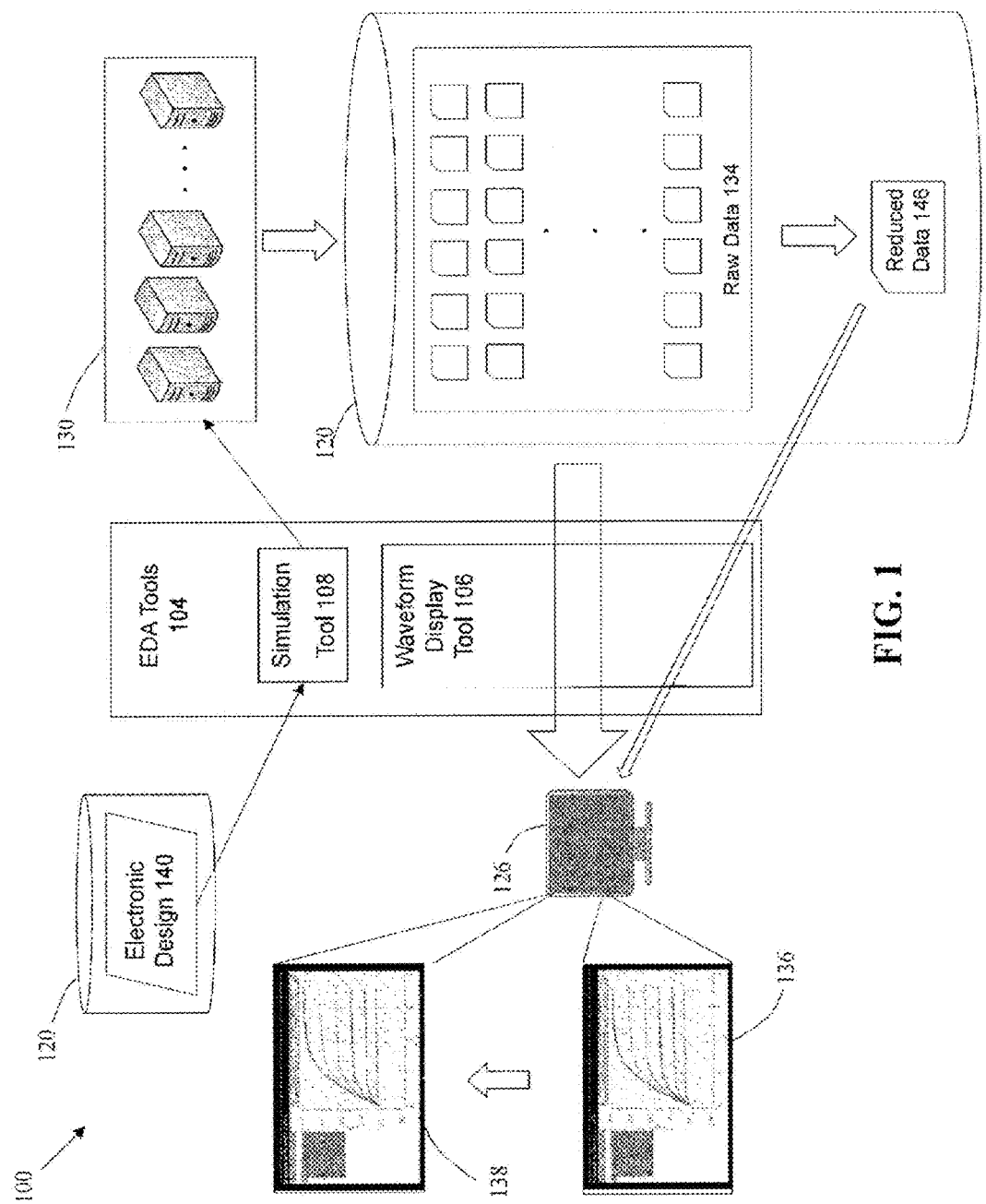
FIG. 1 illustrates an example system which may be employed in some embodiments of the invention to implement waveform visualization of an electronic design.

FIG. 1 illustrates an example system 100 which may be employed in some embodiments of the invention to implement waveform visualization of an electronic design. System 100 may include one or more users that interface with and operate a computing system to control and/or interact with system 100. Such users include, for example, design engineers or verification engineers. The computing system comprises any type of computing station that may be used to operate, interface with, or implement one or more EDA applications 104. Examples of such computing systems include for example, servers, workstations, personal computers, or remote computing terminals connected to a networked or cloud-based computing platform. The computing system may comprise one or more input devices for the user to provide operational control over the activities of the system 100, such as a mouse or keyboard to manipulate a pointing object. The computing system may also be associated with a display device 126, such as a display monitor, for displaying electronic design analysis results to users of the computing system.

The electronic design data 140 and/or any simulation/analysis data may be stored in a computer readable storage medium 120. The computer readable storage medium 120 includes any combination of hardware and/or software that allows for ready access to the data that is located at the computer readable storage medium 120. For example, computer readable storage medium 120 could be implemented as computer memory and/or hard drive storage operatively managed by an operating system, and/or remote storage in a networked storage device, such as networked attached storage (NAS), storage area network (SAN), or cloud storage. The computer readable storage medium 120 could also be implemented as an electronic database system having storage on persistent and/or non-persistent storage.

A graphical user interface may be presented to the user on the display device 126. For example, a waveform display tool 106 may generate a user interface to display waveform data to a user. The waveform data is created by, for example, a simulation tool 108. The user may manipulate and/or operate the waveform display tool 106 to change the way that waveform data is displayed to the user.

One or more EDA tools 104 are operable by a user in system 100 to perform simulation of the electronic circuit design 104. A simulation tool 108 performs various types of simulation as part of the design cycle for an electronic circuit. Due to the level of complexity of modern circuit specifications, simulations such as Monte Carlo and Corner simulations are executed regularly, where the simulation tool 108 coordinates and launches large sets of simulation jobs to be executed in parallel by a plurality of processing nodes 130. This means that there may be a very large number of individual runs (e.g., many thousands of jobs being run) with each single simulation run creating a large amount of data, which collectively create a massive data set 134 that aggregates all of the simulation results from all of the individual simulation runs.

The waveform display tool 106 generates the display data to be displayed on the display device 126. Within the processing infrastructure for the waveform display tool 106, one or more processors (e.g., a central processing unit or CPU) that operate in conjunction with memory and a graphics processing unit (GPU) to generate the display data for the waveforms. The CPU operates to process commands to implement and operate the EDA tool 104, which may involve reading and processing of raw data 134 pertaining to the simulation results. During processing, the raw data 134 may be loaded onto memory, where the GPU may be employed to perform image and graphics processing to generate image data for display on the display device 126.

The problem is that if the user wishes to interactively plot the waveforms onto the display device 126, it is very resource-intensive for conventional waveform display tools to be able to manipulate the vast amount of the raw data 134 for waveforms, which typically leads a significant amount of display latency.

Embodiments of the present invention solve this problem by generating a reduced set 146 of waveform data that is derived from the raw data 134. The issue addressed by embodiments of the invention is that the pixel density of a typical display monitor device is just not dense enough to display the minute level of detail that is implicit in the massive amount of data in the raw data 134—which means that a vast majority of the raw data 134 does not get converted into visually perceptible content on a display device. Therefore, when the graphics engines used for waveform display attempt to interactively render the waveforms for the raw data 134, (a) a large amount of time and computing resources are needed to consume and process that massive amount of data; and (b) most of that time and processing effort may end up being wasted since the display device is incapable of displaying that level of detail. If the raw data 134 is located remote to the processing engine, then there is the further (and not insignificant) cost to transport the many thousands of files that make up the raw data 134 across a network to the location of the graphics processing engine.

With embodiments of the present invention, data reduction is performed to generate a reduced data set 146 that can be displayed to the user in an accelerated manner. The appropriate level of data reduction is determined for visualization of a low screen resolution version 136 of the waveforms that can be quickly plotted onto the display device 126 without undue delays. As discussed in more detail below, the quantity of the waveform data is reduced in an intelligent manner, where the reduced waveform data still retains sufficient data fidelity for accurate data analysis and waveform visualization. Only on an as-needed basis is the full set of data accessed to generate the high screen resolution version 138 for the display device, e.g., where the user identifies some sort of anomaly in the waveforms from the low screen resolution version 136, and selects some of the signals/waveforms for detailed analysis and display in the high screen resolution version 138.

Figure 2:
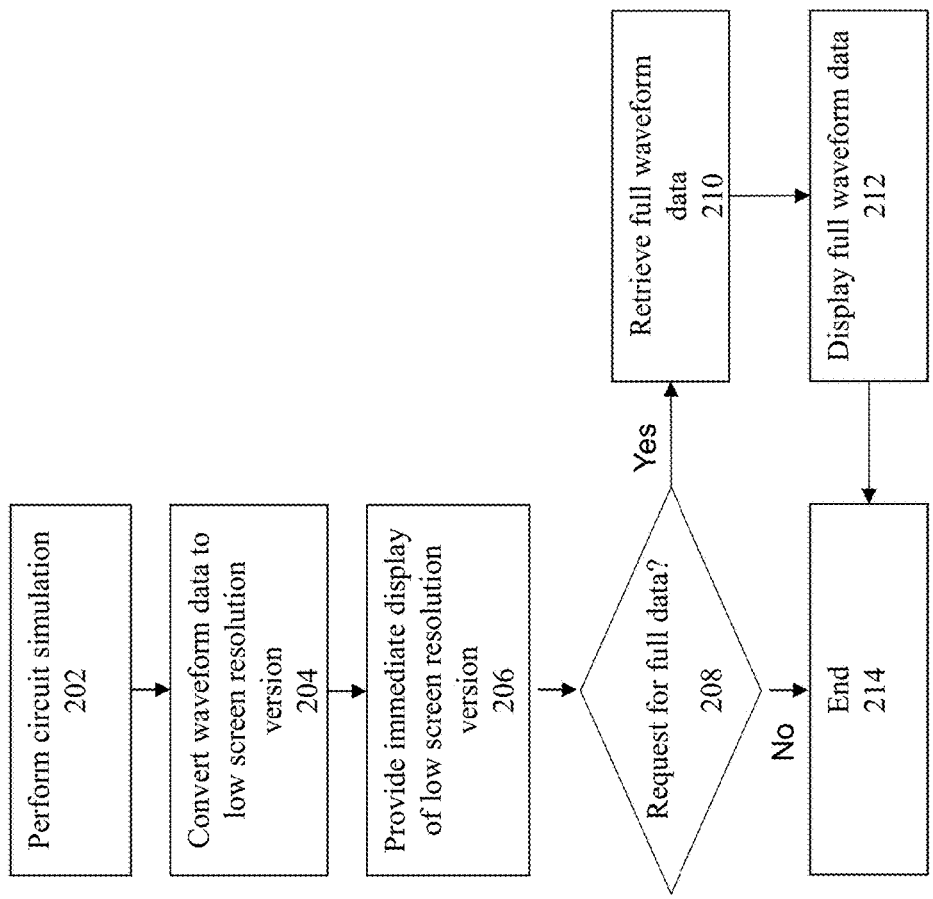
FIG. 2 shows a flowchart of an approach for providing fast access to waveform visualizations by performing data reduction according to some embodiments of the invention.

FIG. 2 shows a flowchart of an approach for providing fast access to waveform visualizations by performing data reduction according to some embodiments of the invention.

At 202, circuit simulation is performed upon the electronic design data. In some embodiments, multiple remote parallel processing entities are launched to perform the simulation jobs. A processing entity corresponds to any suitable combination of software and hardware that is capable of processing work in a computing system, such as a process, thread, task, node, core, processor, server, or any combination thereof. By way of illustration, a remote process may be launched to perform a number of simulations for a number of process corners. For example, some parameter variations that may be simulated include temperatures (e.g., 0° C., 25° C., 50° C.), voltage levels, transistor types (e.g., fast, low, wide), etc. The different parameters and their variations are multiplied to identify the different parameter combinations that are to be simulated by the different remote processes.

In some cases, the processing entities are located on a cloud server in a cloud environment. In one or more embodiments, a cloud server may refer to a hosted server or processing system that is hosting at a different location, and is accessed by multiple users on demand through the Internet or some type of network. In one or more embodiments, a cloud server may be a set of multiple connected servers that comprise a cloud. For example, an EDA company that provides the simulation tool may be the operator of the cloud environment. In an alternative embodiment, the processing entities may be located within on-premises computing platforms local to the user.

At 204, the full set of data generated by the remote processes is converted to a low screen resolution version. In some cases, where there are many thousands of waveform data files due to each of the simulation runs generating a separate results file, the reduced data can be collapsed into a smaller number of one or more reduced data files (or other types of storage implementation such as a database).

At 206, the reduced data set can then be plotted onto the user's display device in an accelerated manner. By creating a reduced set of data, this allows a much smaller amount of data to be processed by the processing infrastructure to generate graphical data for display on the display device. By inducing less load on the processing infrastructure, particularly the GPU, this allows the data throughput of the processing infrastructure to be fast enough to generate the display data for waveforms without experience appreciable amounts of lag or delay in presenting the waveform data to the user. In addition, since the reduced data set is in the form of a smaller number of one or more files (rather than thousands of files for the raw data), this means that significant time and resources savings can be obtained due to the reduced network overhead for transferring the reduced data set from the storage infrastructure (e.g., in cloud storage or at another type of remote storage device) to the device that will graphically process the data for display.

The waveforms for the reduced data set is therefore displayed onto the user's display screen at a data quantity level that is appropriate for the resolution of the display screen. At this point, at 208, the user can decide whether there is any need to plot waveforms from the full data set.

There are numerous reasons why the quick plot of reduced data set may be perfectly adequate for the needs of the user, which means that the full data set may never need to be plotted for the user. For example, if the user seeks a particular item of information that ascertainable from just the quick plot, the full plot may no longer be needed. As an illustration of this scenario, consider if the user is concerned with the time at which a certain event occurs, and the resolution of the waveform in the quick plot is adequate to identify the time of that event. In this situation, the use may not request a full plot, and therefore the determination at 208 is a "NO", at which point the process can end at 214.

However, there are also reasons why the user may choose to continue with plotting some or all of the high resolution waveforms from the full data even after viewing the quick plot of the low resolution version. For example, one vital goal of the simulation process is for the engineer to be able to identify and investigate outliers within the simulation results. The quick plot of the low resolution waveforms may be sufficient for the user to visually see which of the waveforms are "normal" and which waveforms (if any) are outliers. In this situation, the user can then select specific ones of the waveforms from the low resolution plot for further analysis. Therefore, if the determination at 208 is "YES", then the process then proceeds to 210 to retrieve the full data for the selected one or more of the waveforms of specific interest. At 212, the full data set for these selected waveforms can then be plotted and displayed on the display device for the user to analyze in greater detail. Since only a subset of the waveforms needs to be plotted at their full resolution, this means that this action to plot these waveforms can nonetheless be performed quickly and efficiently—even at full resolution—since it is not the entirety of the full data set that is being plotted.

Figure 3:
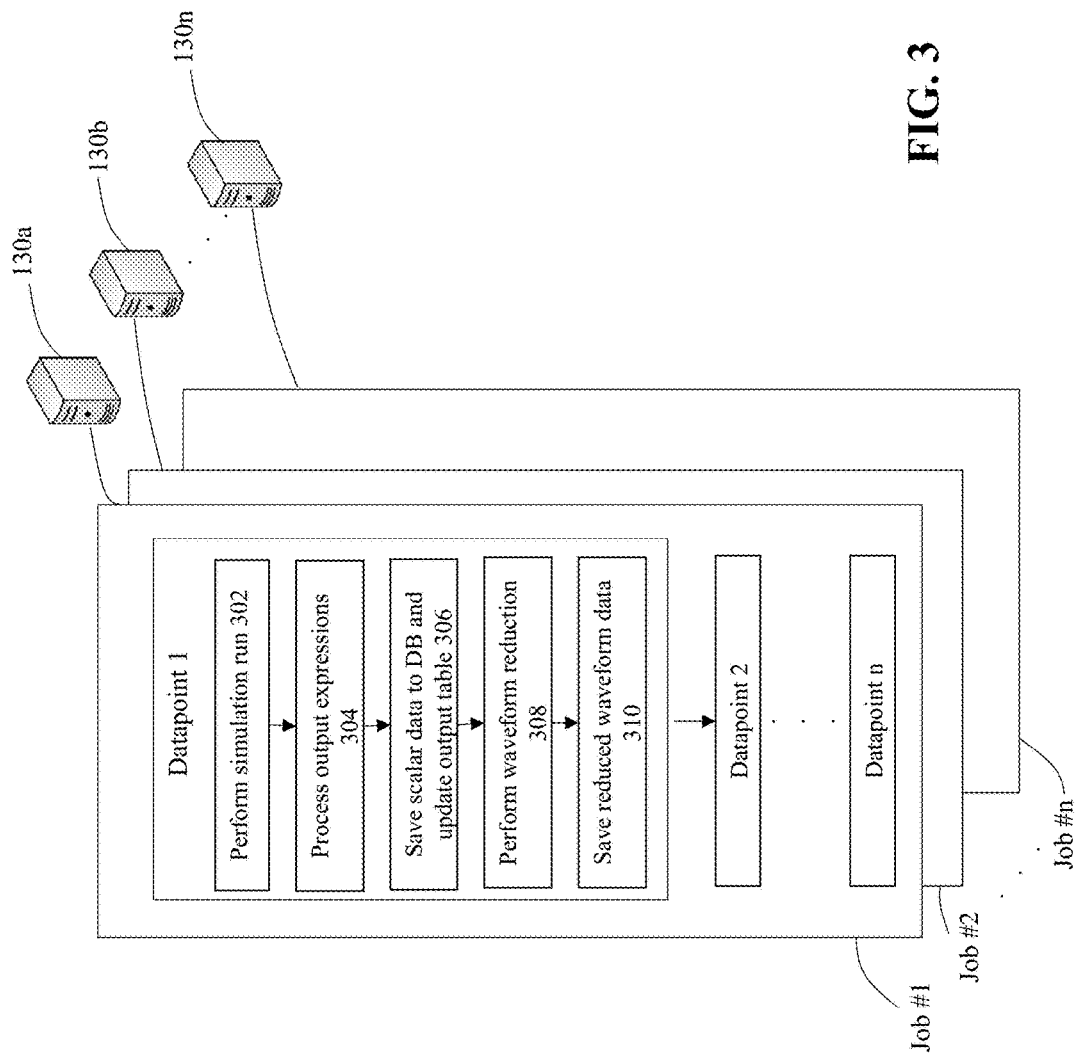
FIG. 3 illustrates a runtime flow to implement some embodiments of the invention.

FIG. 3 illustrates a runtime flow to implement some embodiments of the invention. In some embodiments, multiple remote parallel processing entities are launched to perform the simulation jobs, such as processing entities 130a, 130b, . . . 130n. One or more processing jobs are assigned to each of the processing entities. Here, job #1 is assigned to processing entity 130a, job #2 is assigned to processing entity 130b, and job #n is assigned to processing entity 130n. Each job may include one or more datapoints. A datapoint corresponds to one invocation of the circuit simulation having a specific set of processing parameters followed by post-processing at each remote process. While this figure is greatly simplified to illustrate only a few jobs having only a few datapoints, it is noted that an actual modern electronic design undergoing simulation may correspond to a large number of jobs having many thousands or even millions of datapoints.

For each datapoint, at 302, a simulation run is performed. The simulation run may be performed by any suitable simulation tool, e.g., one that operates to simulate an analog or analog-mixed-signal circuit. At 304, output expressions are processed from the simulation run. These output expressions are the results from performing the simulation for the process parameters associated with the datapoint. At 306, the data results (e.g., scalar values) are then stored into a database that is configured to hold these values. An output table is updated corresponding to the saving of simulation result data to the database.

Waveform reduction is then performed at 308, where the output signals are accessed to generate the reduced signal/expression waveforms. As discussed in more detail below, the waveform data is reduced such that the quantity of the data is significantly reduced, while still retaining the accuracy of pertinent datapoints (e.g., preserving original high or low data values for each discrete portion of the data being reduced) such that accurate data analysis and waveform visualization of the reduced signals can be performed. This permits the graphics to preserve data integrity at zoom levels.

At 310, the reduced data is then stored into a designated storage location. For example, a "quick plot" storage (e.g., a file or database) can be established to hold the set of reduced data. Each of the different datapoints may have their individual items of reduced data stored within the same storage so that the collected quantity of reduced data is stored within the same storage. In this way, when the user desires a quick plot of the waveforms, this reduced storage is then retrieved and plotted to display all of the reduced resolution images to the user. In an alternative embodiment, multiple such storage implementations (files/databases) may be employed, where a partitioning scheme is employed to direct the appropriate portions of reduced data to the appropriate file/database/database portion. It is noted that some or all of the remote processes may use an independent database to avoid locks and conflicting access issues.

Figure 4:
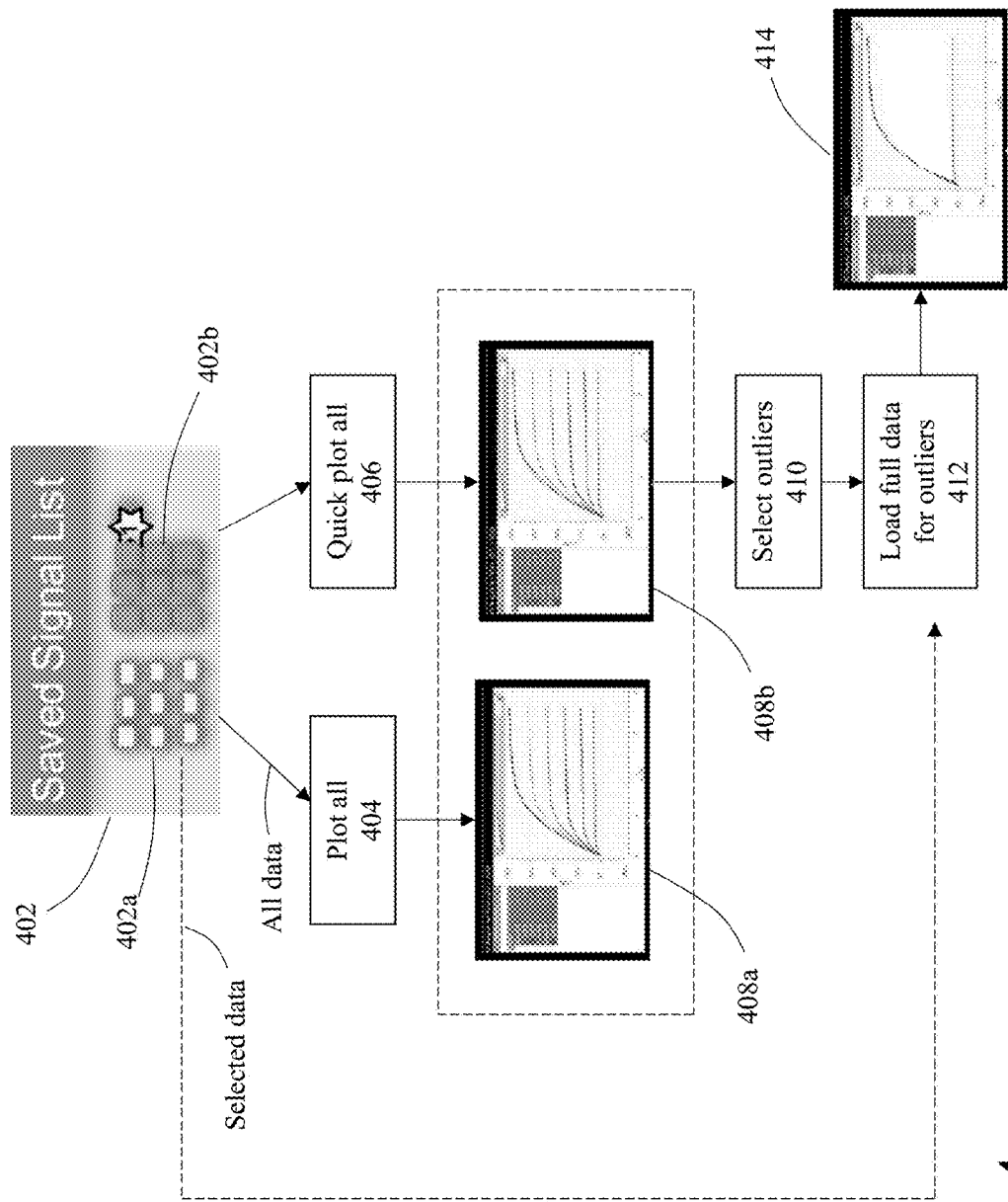
FIG. 4 illustrates a data visualization flow according to some embodiments of the invention.

FIG. 4 illustrates a data visualization flow according to some embodiments of the invention. The saved signal list 402 includes both the raw data set 402*a* and the reduced data set 402*b*.

After simulation has finished, the data can be visualized in a number of different ways. At 404, an instruction to plot all of the raw data may be performed. This provides the capability to show all of the data point waveforms for a given signal. However, since this is the entirety of the raw data 402*a* that is to be plotted, the amount of data to be retrieved and plotted may be quite substantial, and hence a significant amount of time, memory, and computing resources may be required to generate the visual presentation 408*a* of the waveforms for the full data set.

In contrast, at 406, an instruction may be received to quick plot all of the reduced data set 402*b*. As discussed above, the reduced data set can be very quickly plotted to generate the visual presentation 408*b* of the waveforms for the reduced data set. This greatly improves the interactive functionality to the user for viewing the waveforms in an efficient manner.

The user may then review the quick plot version 408*b* of the waveforms to identify the specific traces of interest (e.g., outliers), and to select those specific traces at 410 for further detailed analysis. At 412, the raw data for the selected signals are then loaded and plotted to generate the visual representation 414 for the display device.

This portion of the disclosure will now provide an example approach to perform data reduction that preserves the fidelity of the original data set while reducing the volume of data to suit the screen resolution of the display device.

In general, data reduction is performed by dividing the (X,Y) waveform datapoints into a specific set of "slices" along the X axis, where each slice corresponds to a set of data from the original dataset that is processed together as a unit for data reduction purposes. For each slice, the filtering process records a certain subset of the datapoints in that slice, while discarding the rest of the datapoints. In some embodiment, the retained subset of datapoints corresponds to the first datapoint in the slice, the last datapoint in the slice, the datapoint having the maximum Y-axis value, and the datapoint having the minimum Y-axis value. All other datapoints are discarded. In some cases, a slice may retain less than four datapoints if the same datapoint corresponds to multiple ones of these categories, e.g., where the first datapoint is also the maximum and/or minimum Y-axis datapoint.

When rendering the waveform for display, this means that regardless of the number of datapoints in the original waveform dataset, a maximum of only four datapoints needs to be rendered for any of the slices in the waveform. The number of slices will therefore control the amount of data reduction, where a smaller number of slices translates to a greater amount of data reduction.

Figure 5:
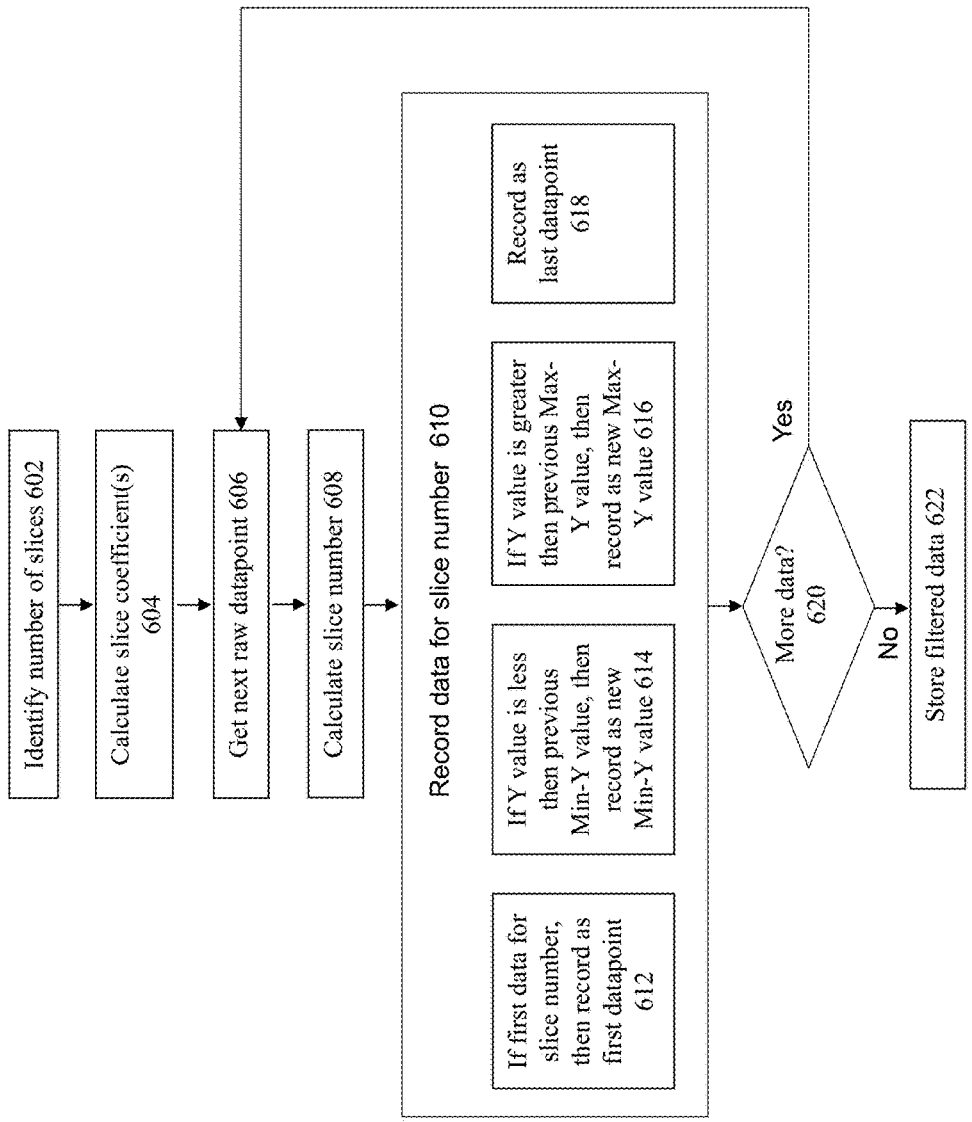
FIG. 5 shows a flowchart of an approach to implement filtering of the waveform data according to some embodiments of the invention.

FIG. 5 shows a flowchart of an approach to implement filtering of the waveform data according to some embodiments of the invention. At 602, identification is made of the number of slices for the data reduction. Any number of appropriate factors can be taken into consideration to determine the number of slices, such as thickness of displayed lines, magnification level of the waveform on the user interface, number of waveforms to simultaneously display, tuning for the displayable resolution of the screen display, and/or user preference for the data reduction. If the displayed line width is thicker/visually magnified, then a smaller number of slices may be used to increase data reduction, since any extra data resolution from having a larger number of slices would be extraneous. Similarly, the user-desired magnification levels may control the level of detail and/or viewable set of data that should be retained, with excess data filtered from the dataset by reducing the number of slices. With regards to the number of simultaneous waveforms to display, an increase in the number of waveforms to display could be used to reduce the number of slices for the data. In addition, the user preferences for data reduction can be used to control with number of slices, with user instructions for greater data reduction being translated into a correspondingly smaller number of slices. With regards to screen resolution, the number of slices can be tuned to correspond to the number of viewable pixels on the display screen, so that excess datapoints that will not meaningfully affect the viewable waveforms are filtered from the dataset.

At 604, one or more slice coefficients are calculated to perform integer rounding of each X value in the raw data into a slice number. The slice coefficient value can be used, for example, as a multiplier against the X value of a given datapoint, where integer rounding is then performed to derive the slice number of that datapoint. For example, if the full dataset of waveform data extends for 10 seconds along the X axis and the number of slices is configured to be 10, this means that the slice coefficient will cause all datapoints from 0 to just short of 1 second to translate to slice number 1, the next set of data points up to 2 seconds to translate to slice number 2, and so on. This means that all datapoints will corresponds to at least one of the 10 slices.

At this point, the process walks through the entire set of the raw data along the X-axis to perform the filtering. At 606, the next datapoint is selected for processing. If this is the start of the process, this means that the very first datapoint is selected for processing. Using the slice coefficient, a slice number is calculated for that datapoint at 608.

Certain information is then recorded for each slice number at 610. For example, for each slice number, the process records the first datapoint for that slice (612), the datapoint with the minimum Y value (614), the datapoint with the maximum Y value (616), and the last datapoint for the slice (618). In some embodiments, if the slice number is directly adjacent to the next slice number, then the process discards the last datapoint, as this is unnecessary for drawing purposes.

At 620, the process checked whether there are any further datapoints to process. If so, then the process returns back to 606 to select the next datapoint for processing. This processing therefore walks through the data along the X-axis, where any subsequent datapoint for a given slice that is either greater than the previous max Y value, smaller than the previous min Y value, or is potentially a new last datapoint for the slice will overwrite the previous datapoint that was recorded for that slice for that category. If there is no further data for processing, then the filtered data is stored at 622.

At the end of the processing, each slice will have reduced its set of datapoints to no greater than four datapoints that correspond to the four categories described above. This is regardless of the original number of datapoints in a given slice. This type of processing is computationally very inexpensive to perform, and hence can be readily implemented in real-time even for very large datasets. In addition, this type of filtering is capable of achieving significant reductions in the quantity of the waveform data, depending upon the number of slices selected for the filtering.

Figure 6A:
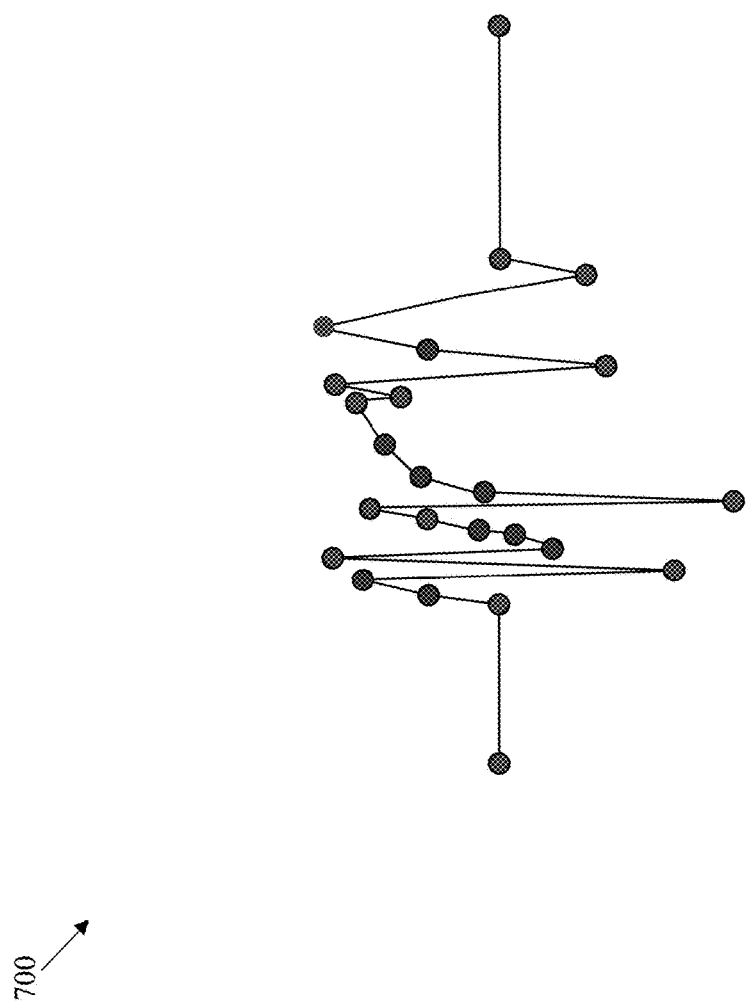
FIGS. 6A-B illustrate correlation of slices to raw data.

To illustrate this process, consider the example set of data 700 shown in FIG. 6A. This set of data 700 includes numerous data points, where each of the datapoints is associated with a specific (X,Y) coordinate value. Assume that this set of data 700 corresponds to a waveform for which there is a desire to perform data reduction.

The first step is to identify the number of slices for the data reduction. As noted above, any number of factors can be taken into consideration to determine the number of slices, such as thickness of displayed lines, magnification level of the waveform on the user interface, number of waveforms to simultaneously display, tuning for the displayable resolution of the screen display, and/or user preference for the data reduction.

Figure 6B:
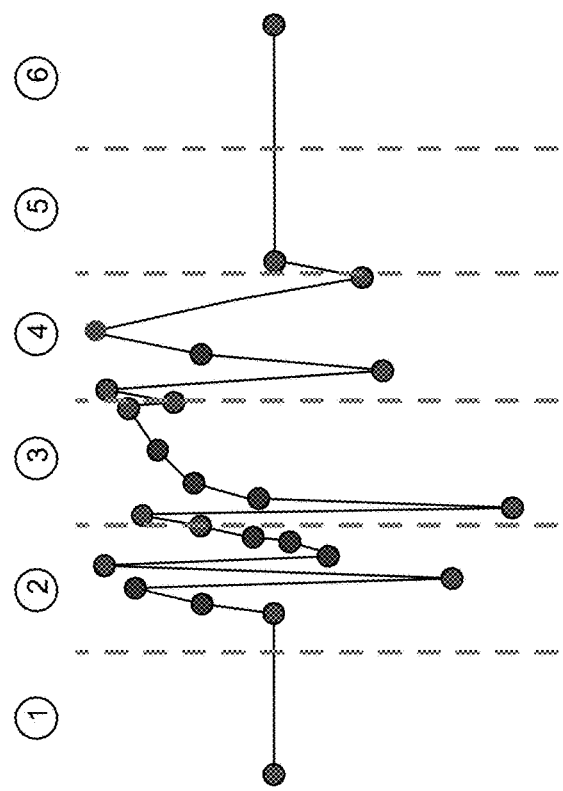

Assume for the sake of illustration that the dataset is to be divided into six slices. A slice coefficient is identified so that each of the datapoints will translate to correspond to one of the six slices. FIG. 6B illustrates example boundaries that may be established for the six slices for dataset 700.

The next step is to walk through the dataset 700 and to identify, for each slice, the datapoints that correspond to the four categories of (a) starting datapoint, (b) minimum Y datapoint, (c) maximum Y datapoint, and (d) ending datapoint.

Figure 7A:
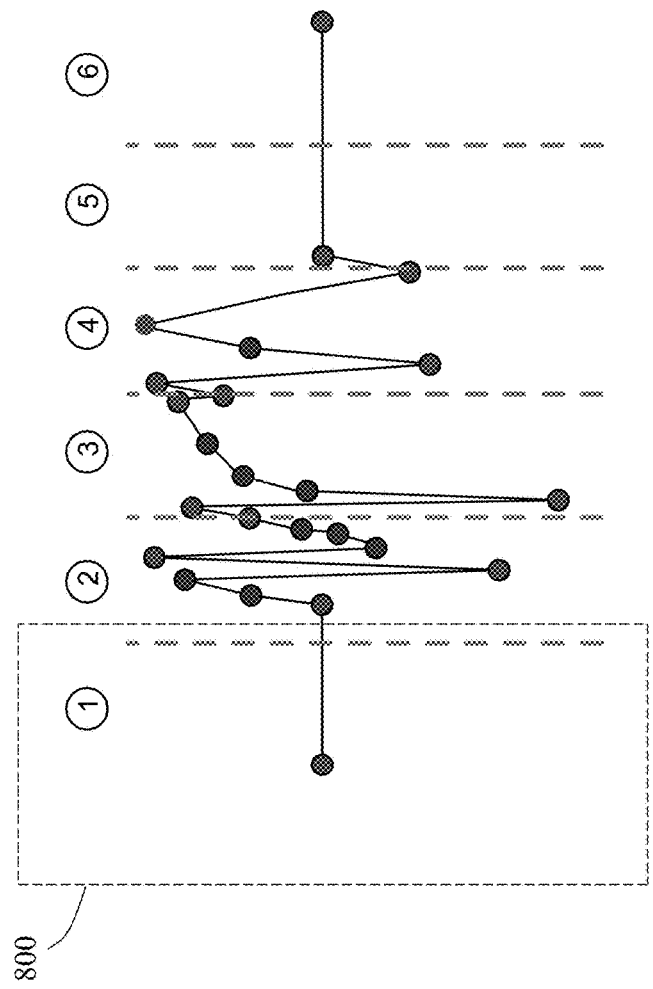
FIGS. 7A-C, 8A-T, 9, 10, 11, 12, and 13 illustrate data reduction applied to an example waveform dataset.
Figure 7B:
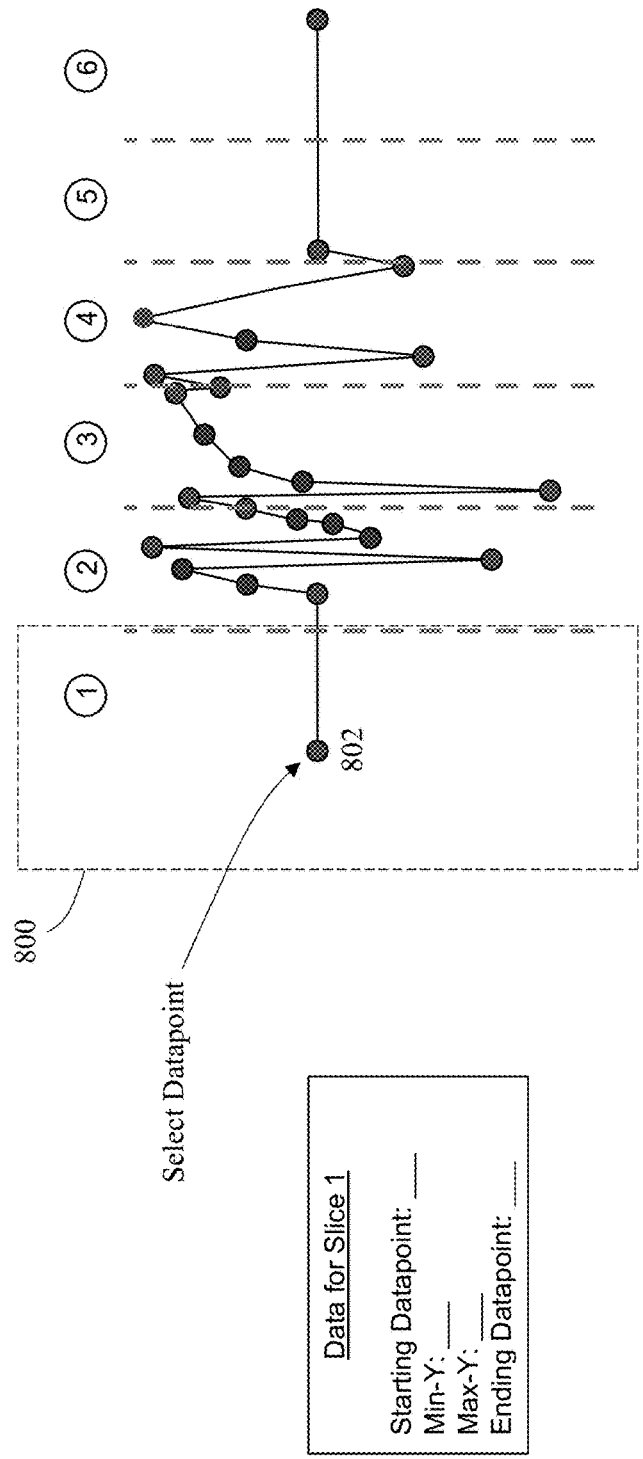
Figure 7C:
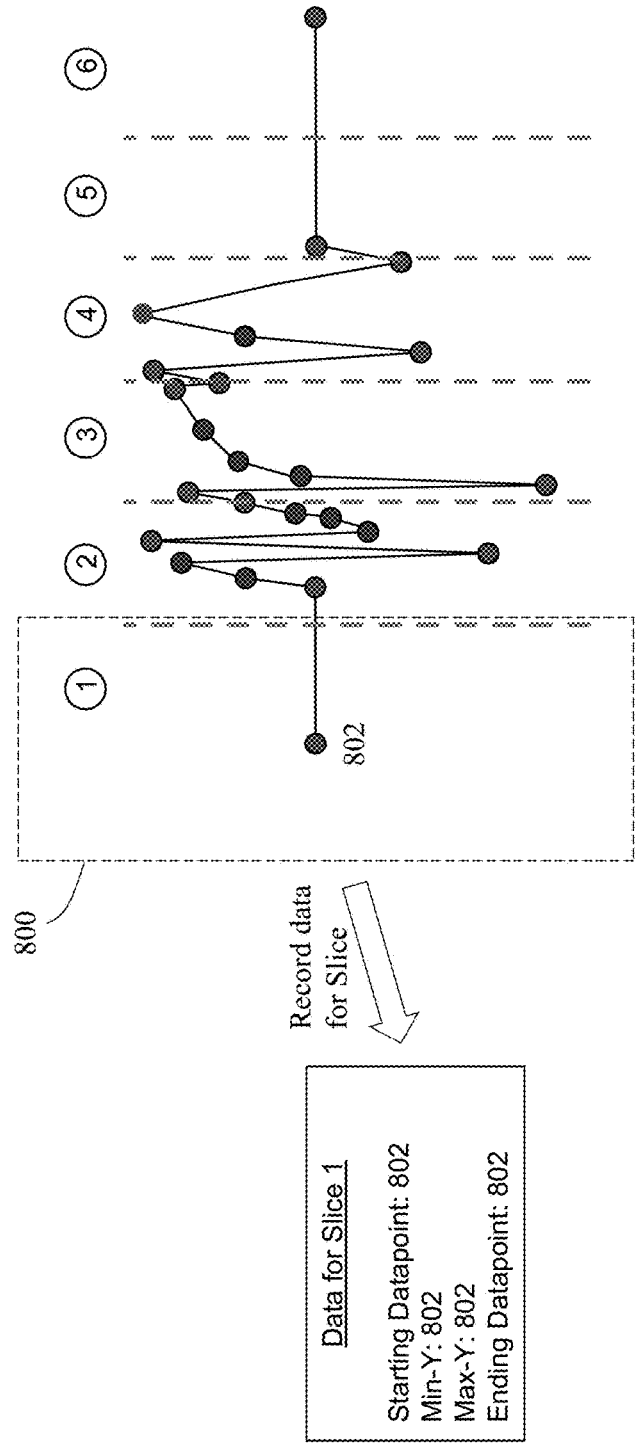

FIGS. 7A-C illustrate this process for the first slice. In FIG. 7A, box 800 is drawn to represent the space of any datapoints having an X value which translates to the first slice. As shown in FIG. 7B, the first datapoint 802 is selected for processing. In this situation, the X value of datapoint 802 translates to slice number 1. Therefore, as shown in FIG. 7C, this datapoint is recorded for each of the four categories for slice number 1 for (a) starting datapoint, (b) minimum Y datapoint, (c) maximum Y datapoint, and (d) ending datapoint. Since there are no other datapoints that correspond to slice number 1, no further processing will occur that will update any of these categories for slice number 1.

Figure 8A:
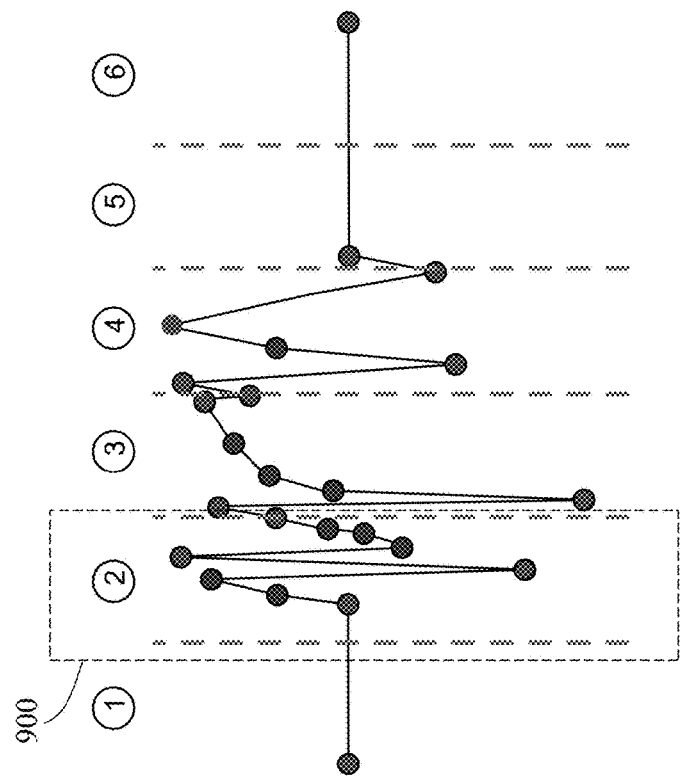
Figure 8B:
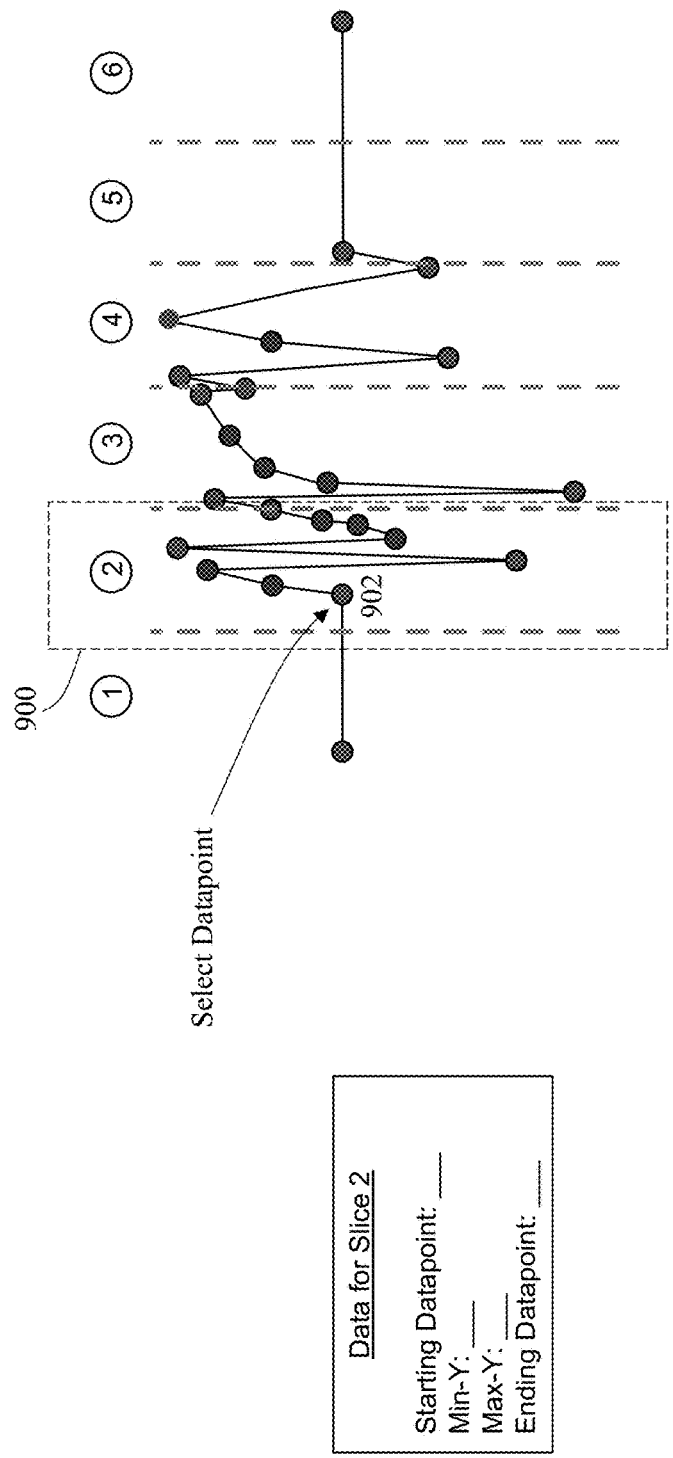
Figure 8C:
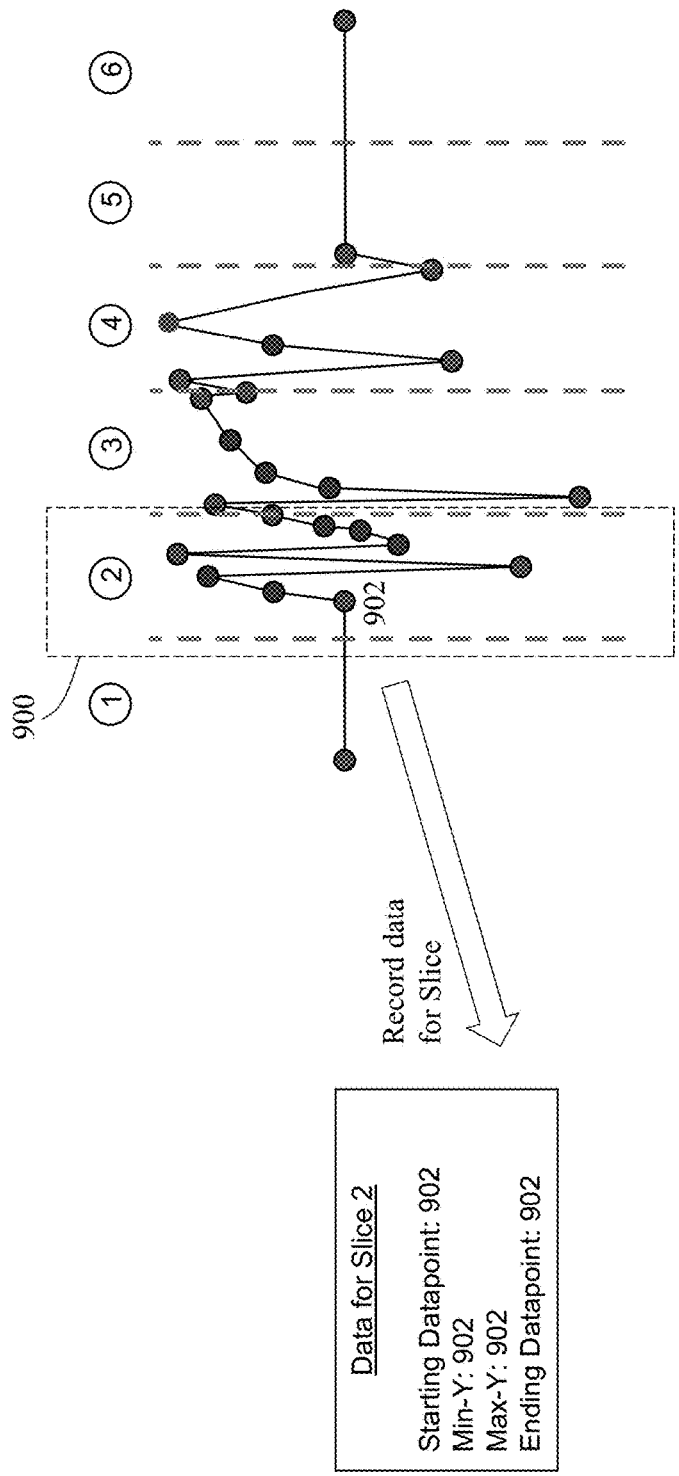
Figure 8D:
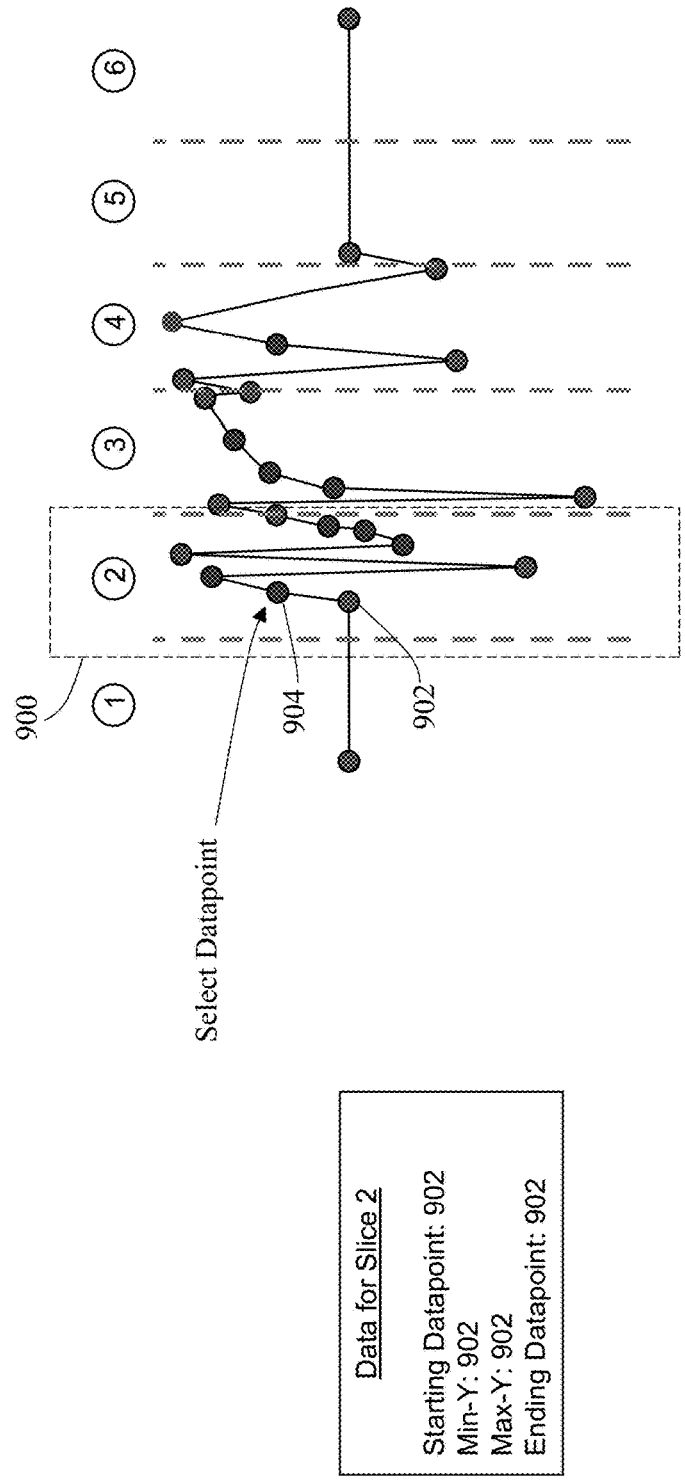
Figure 8E:
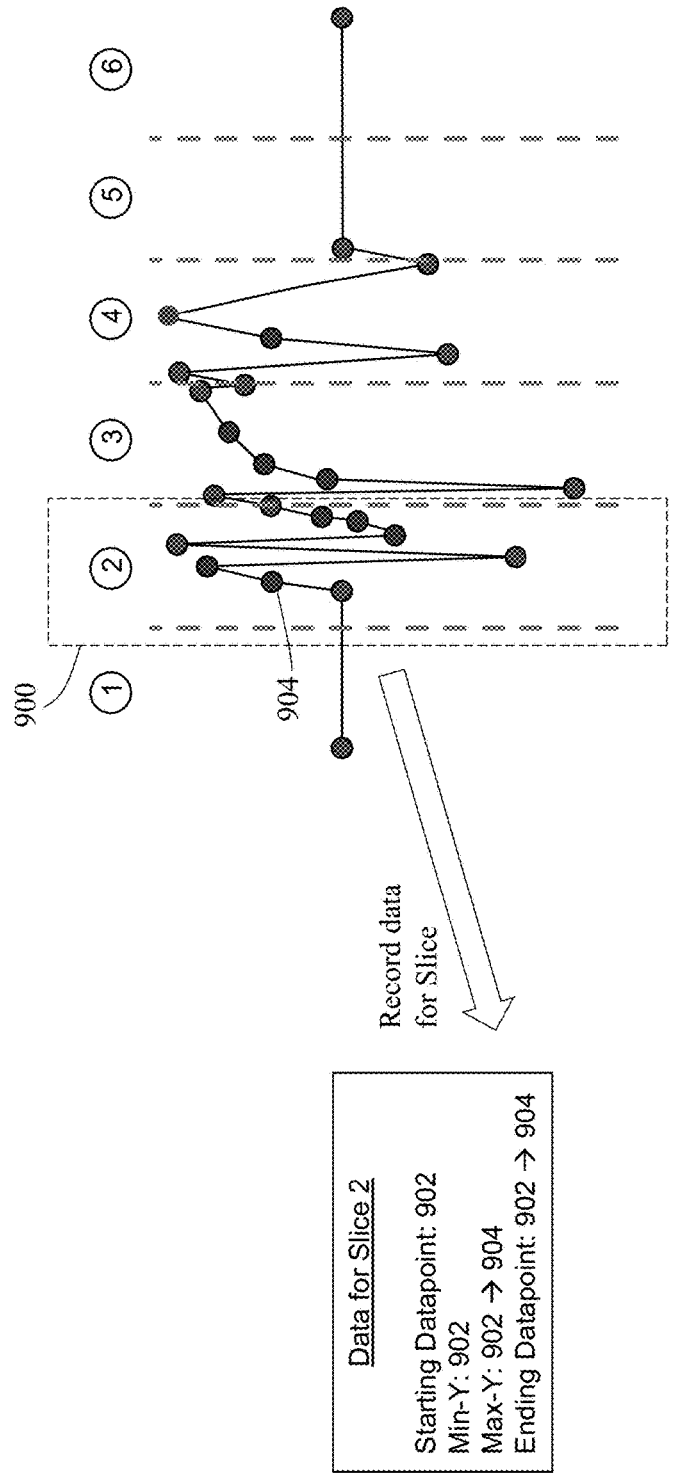
Figure 8F:
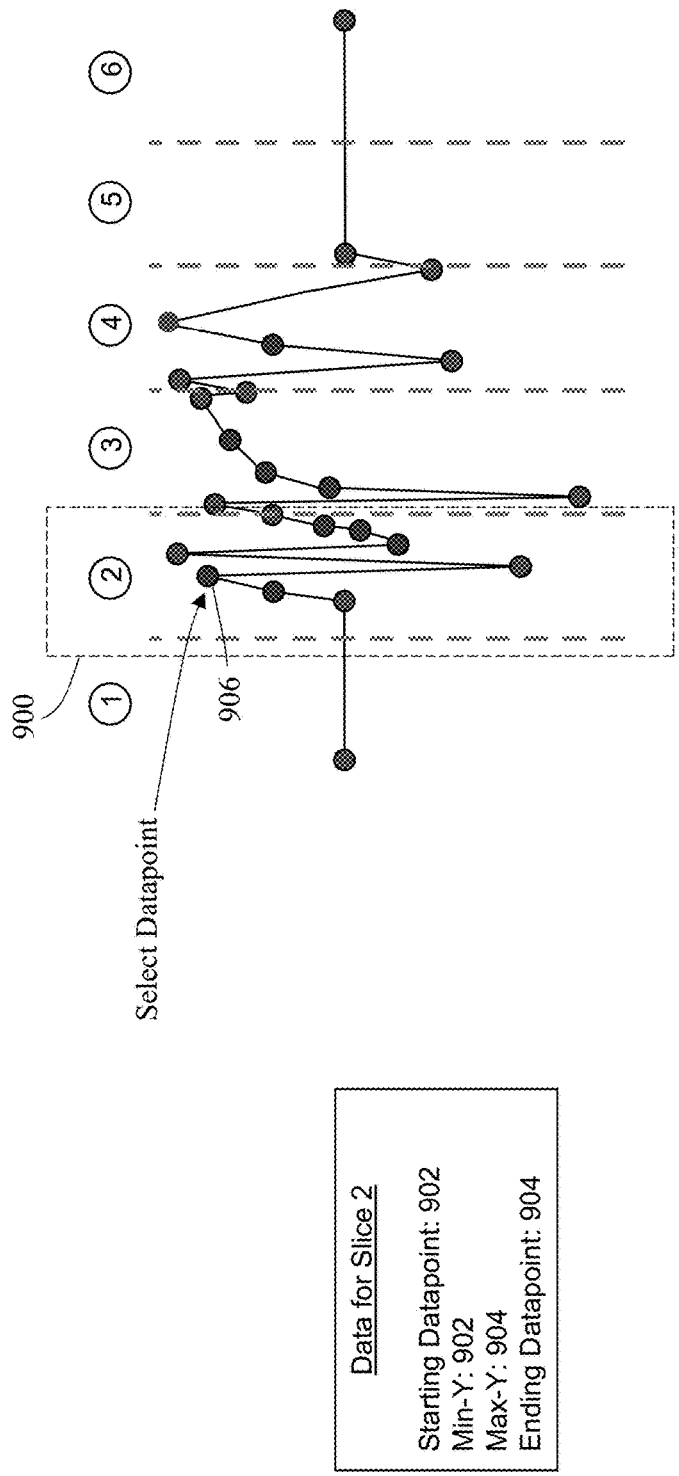
Figure 8G:
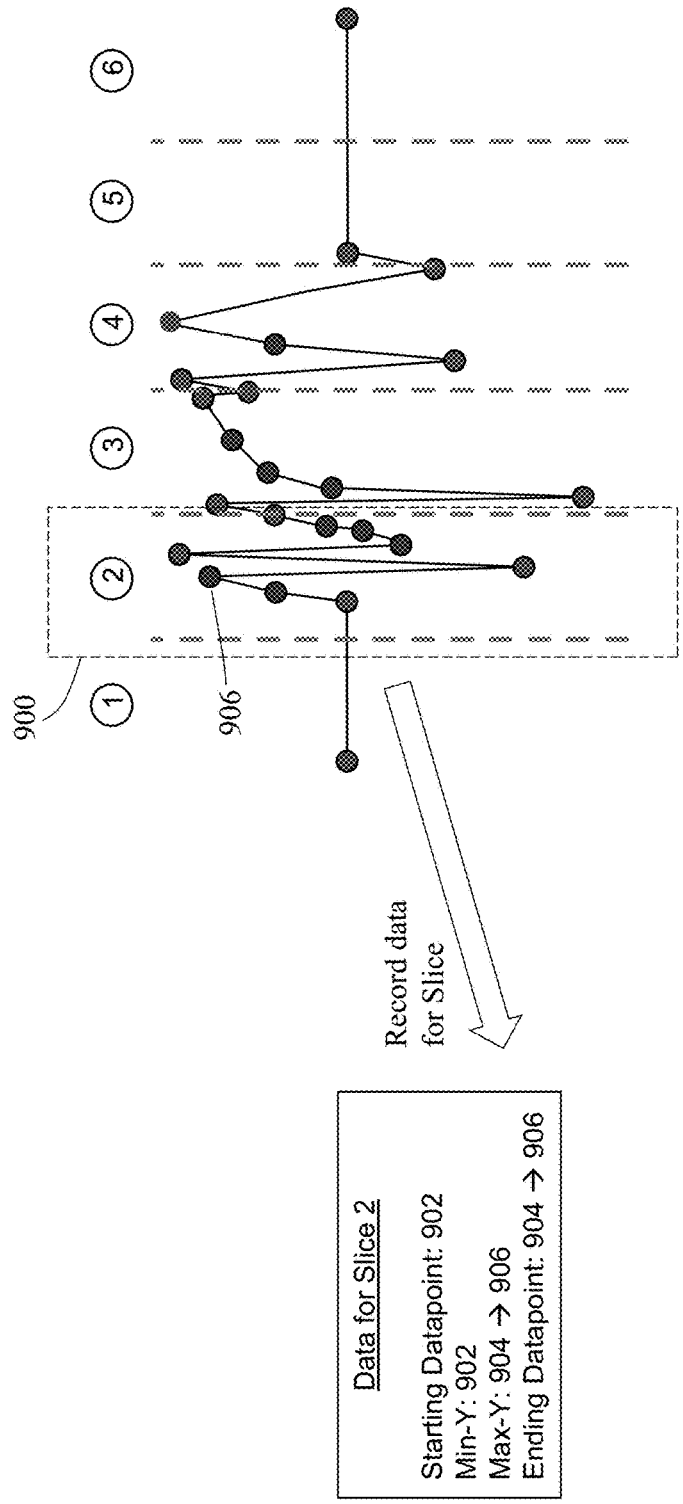
Figure 8H:
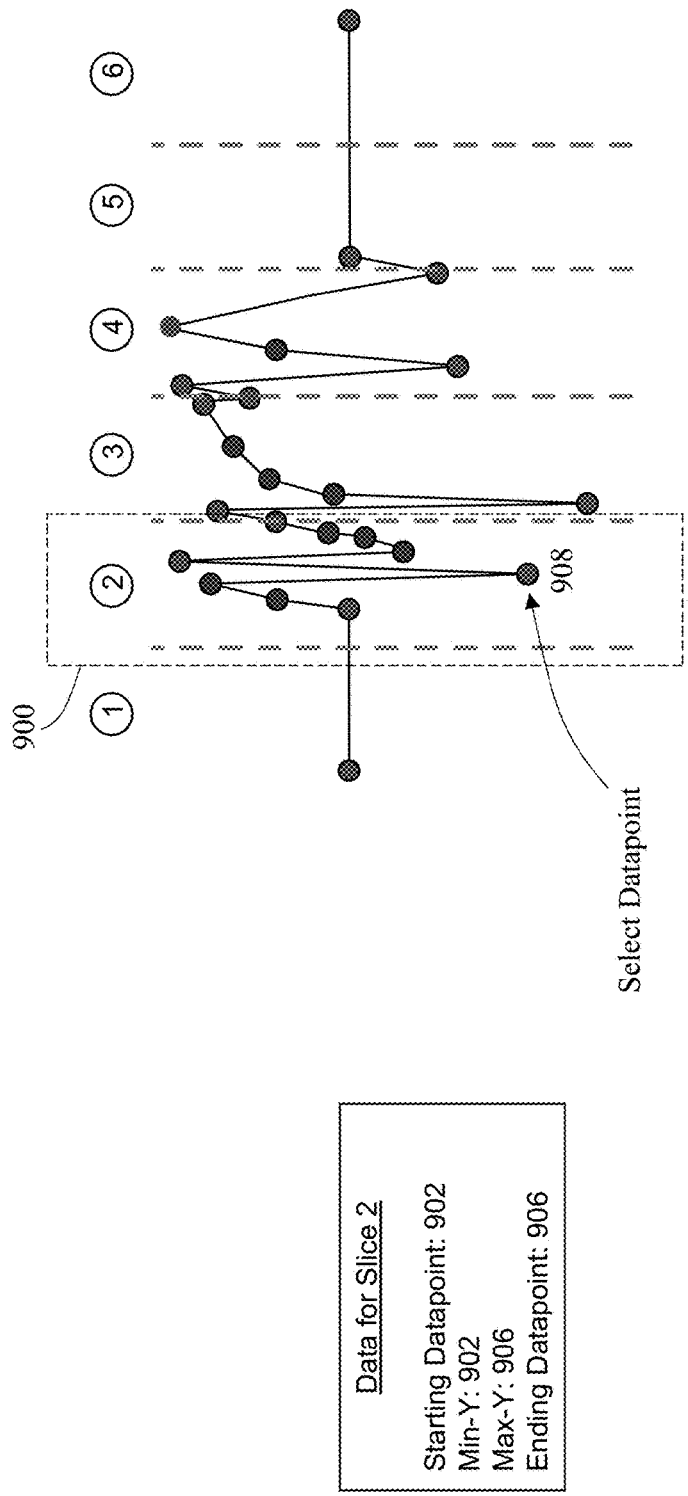
Figure 8I:
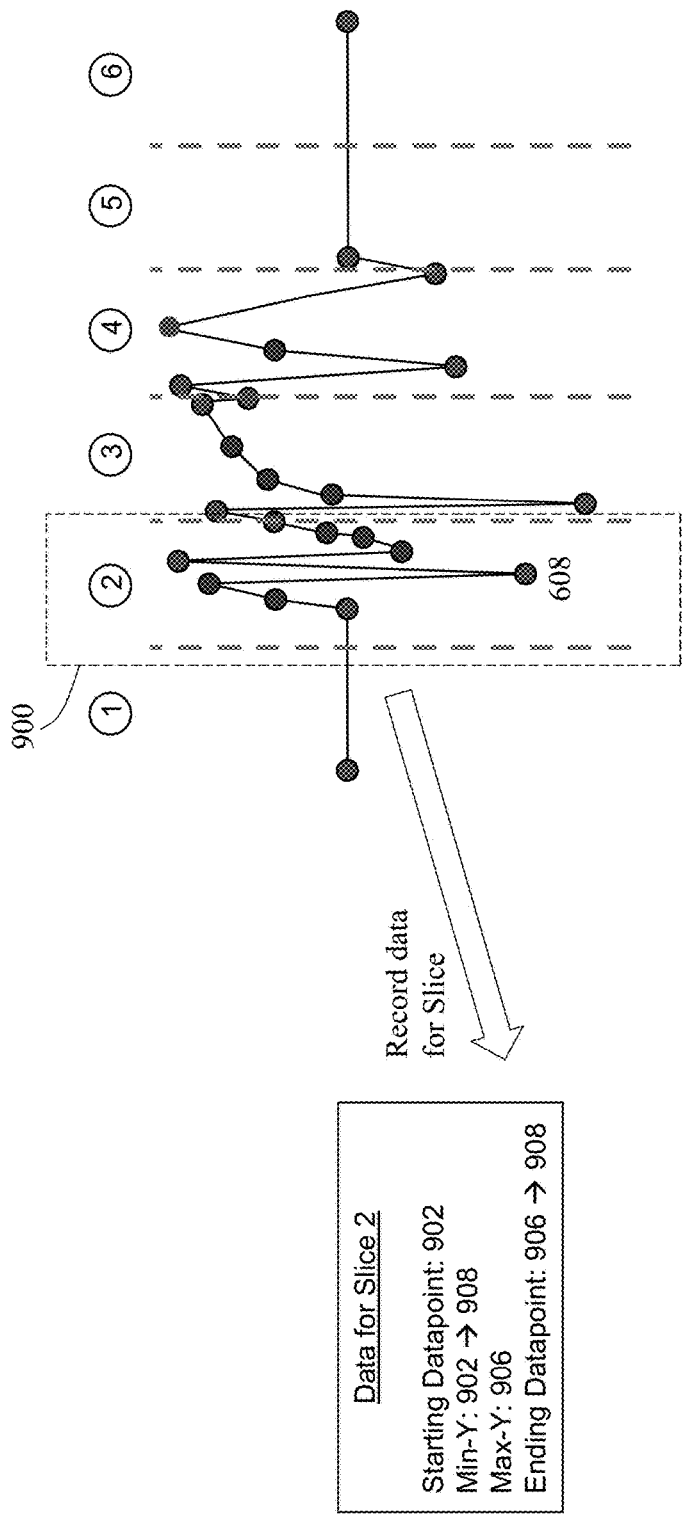
Figure 8J:
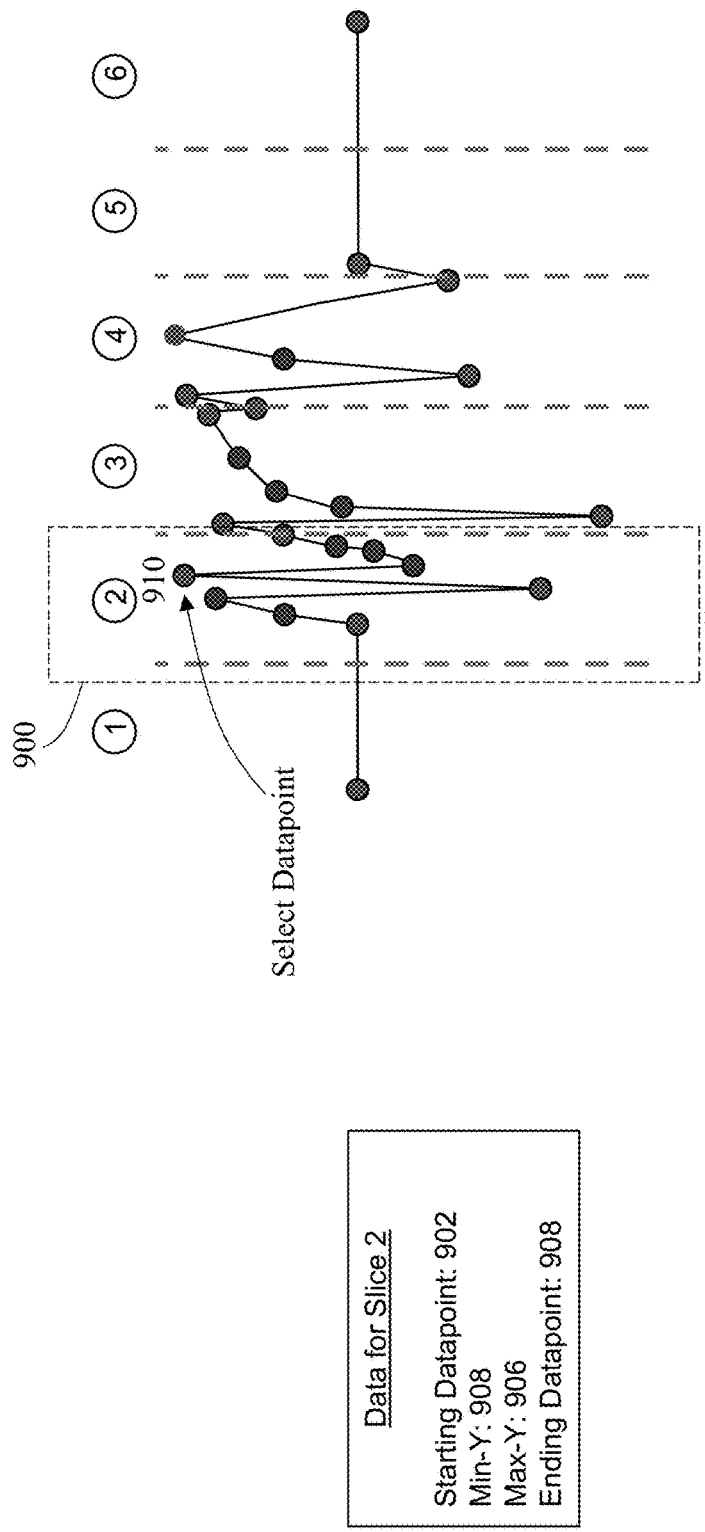
Figure 8K:
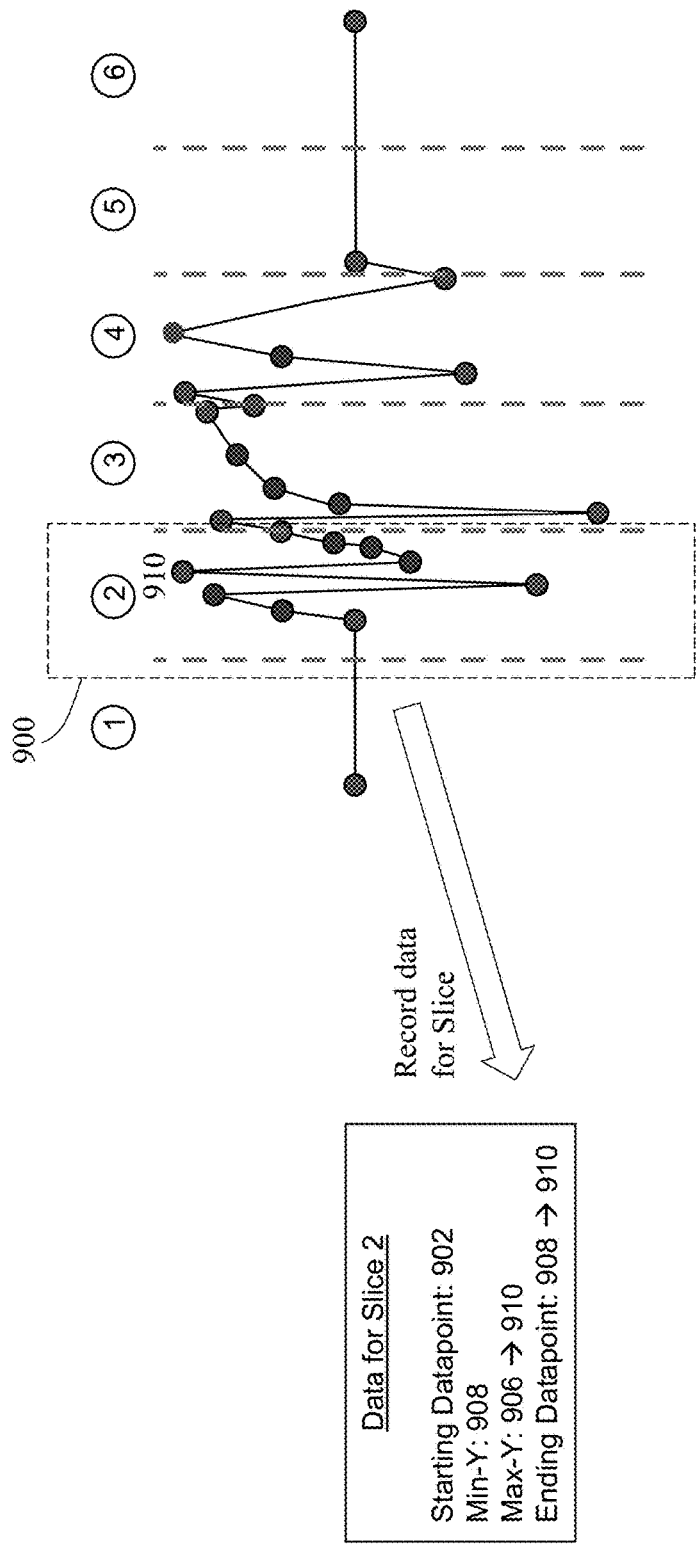
Figure 8L:
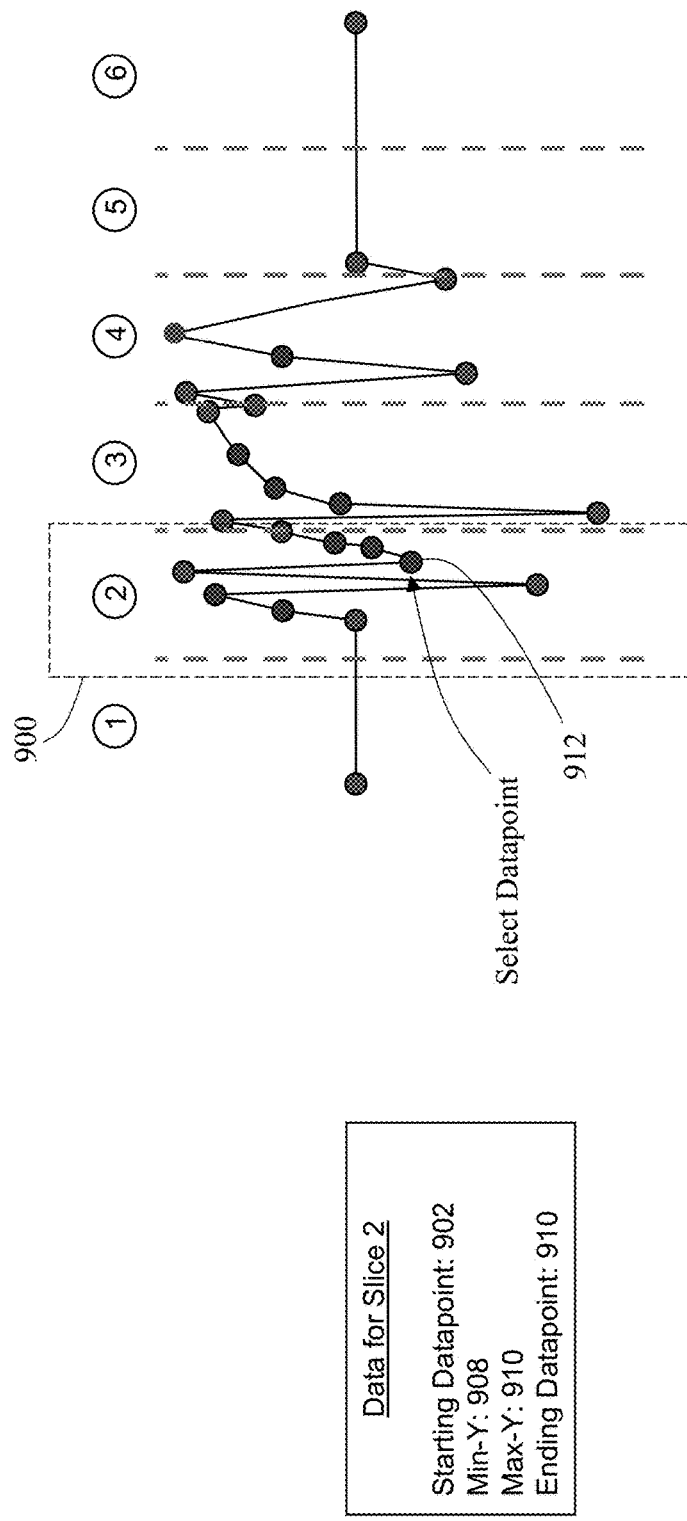
Figure 8M:
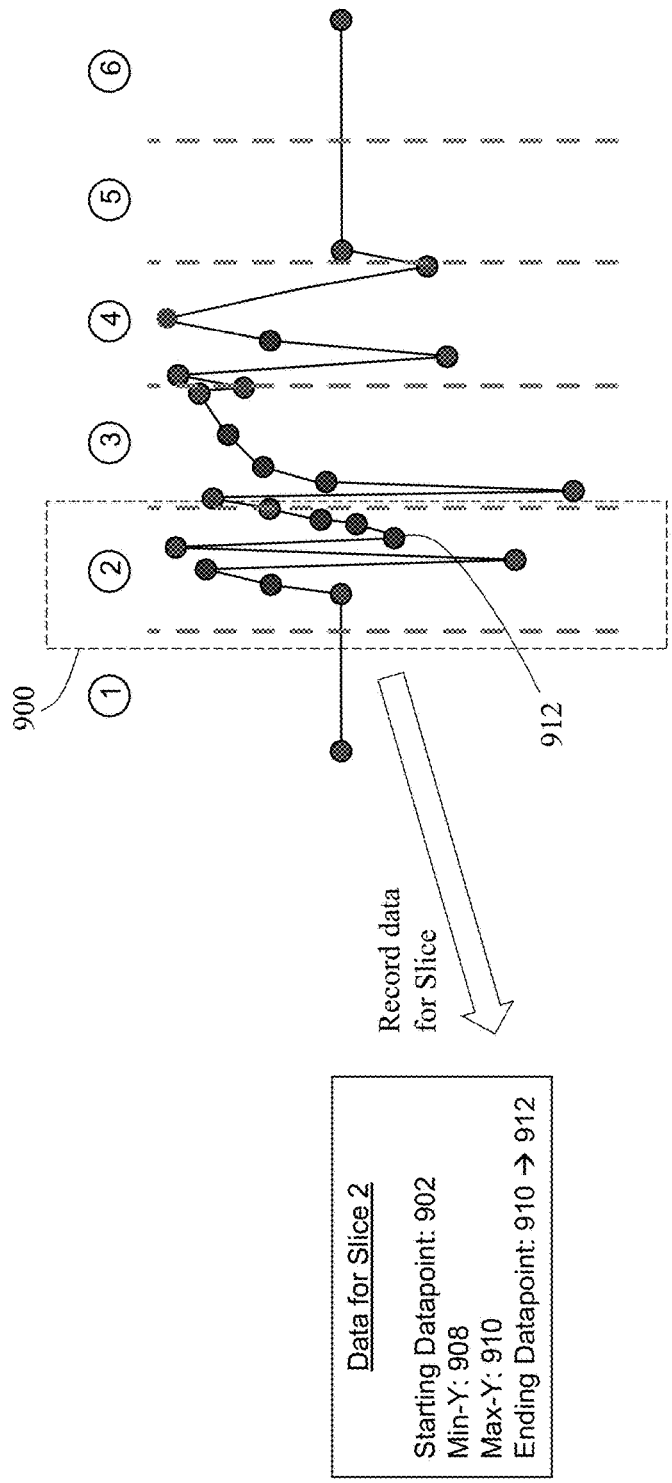
Figure 8N:
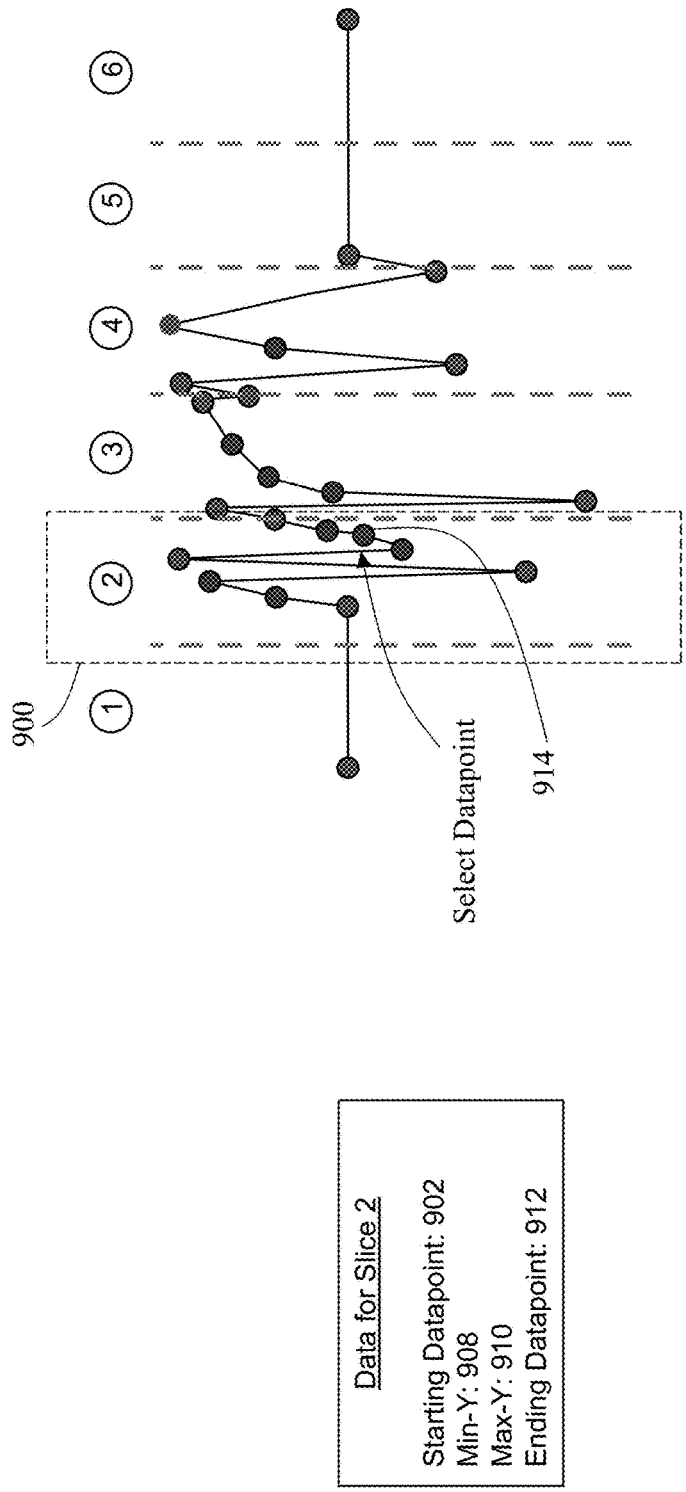
Figure 8O:
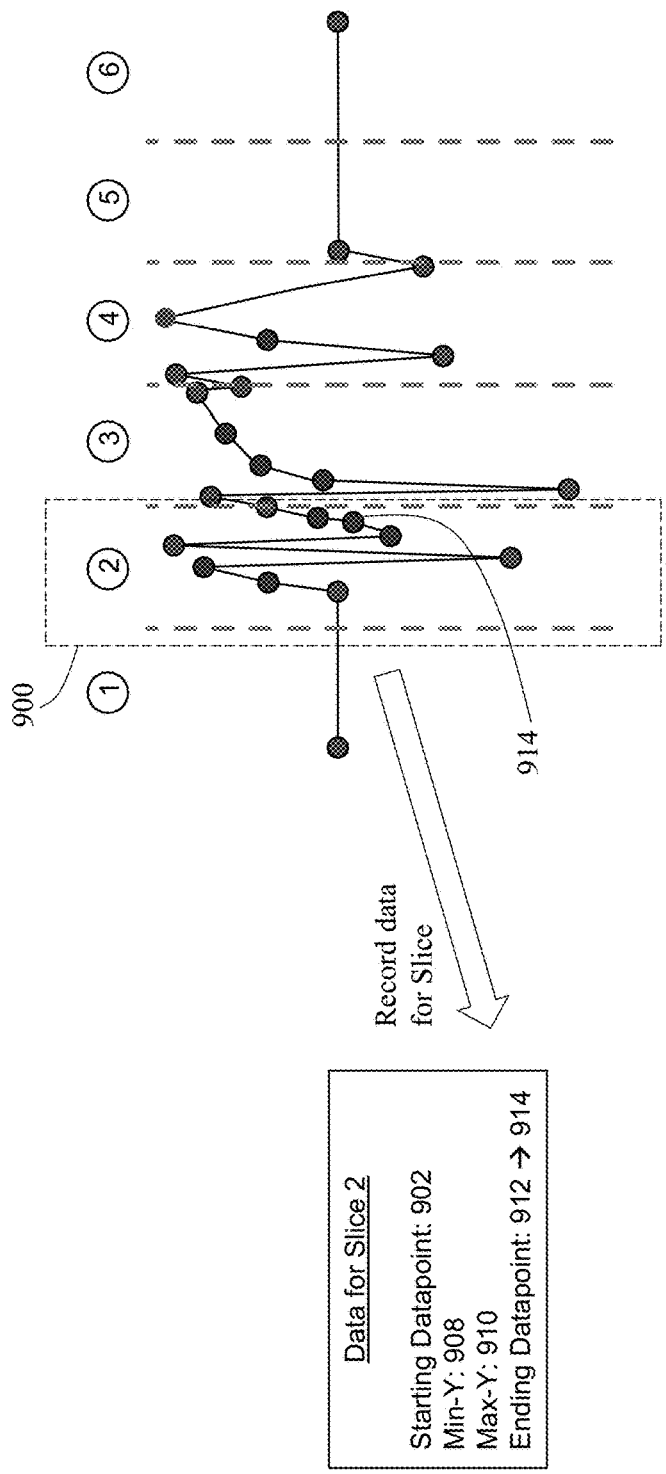
Figure 8P:
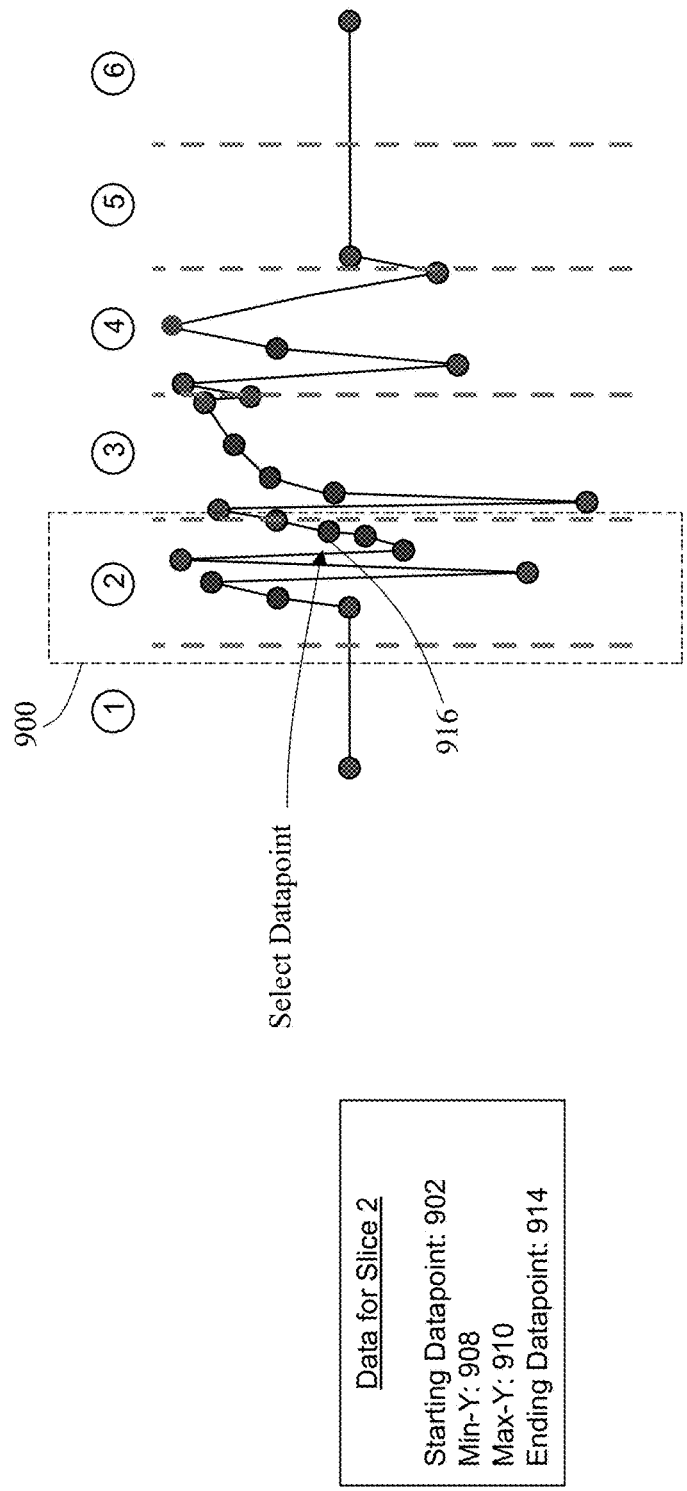
Figure 8Q:
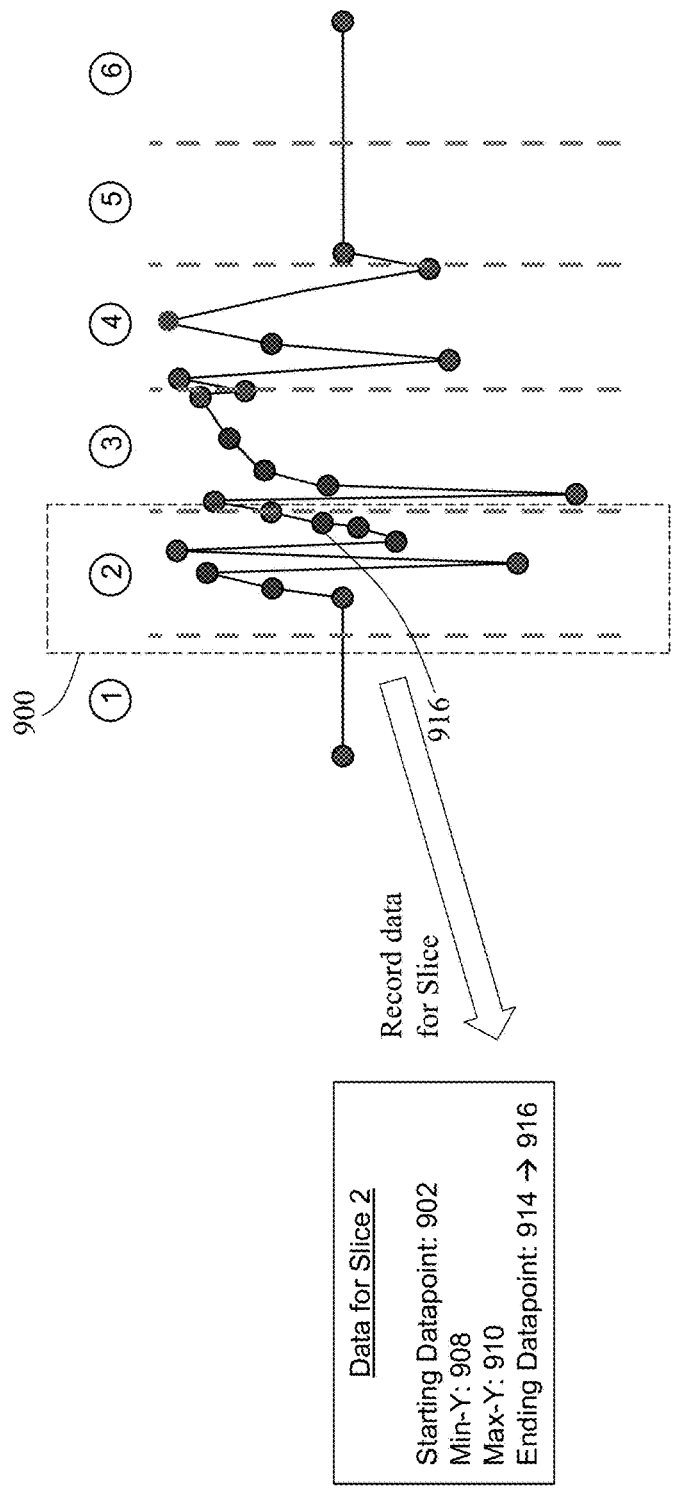
Figure 8R:
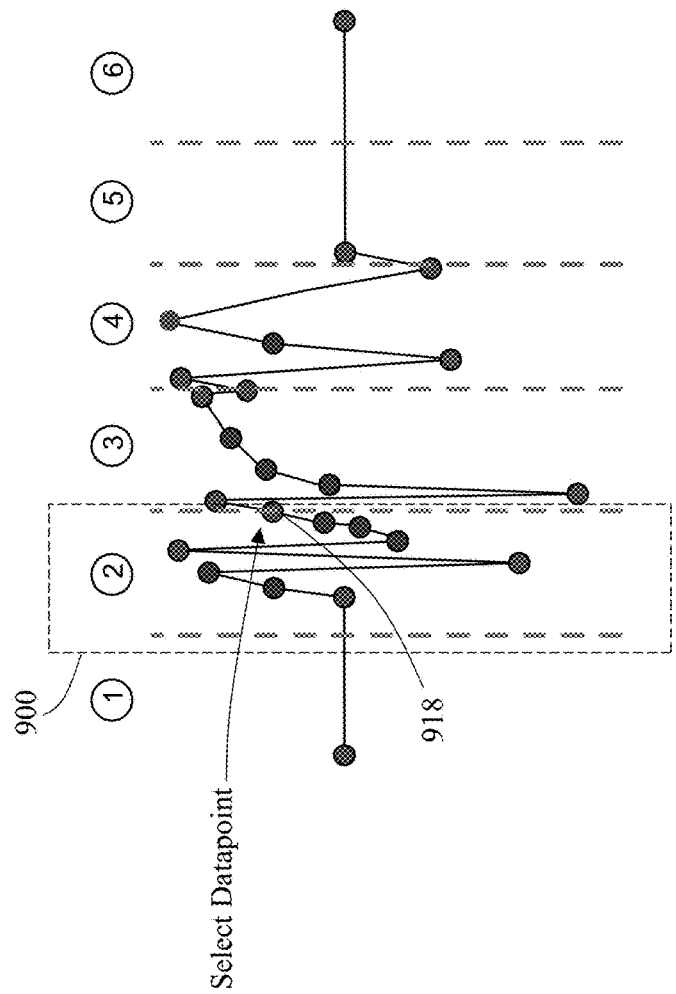
Figure 8S:
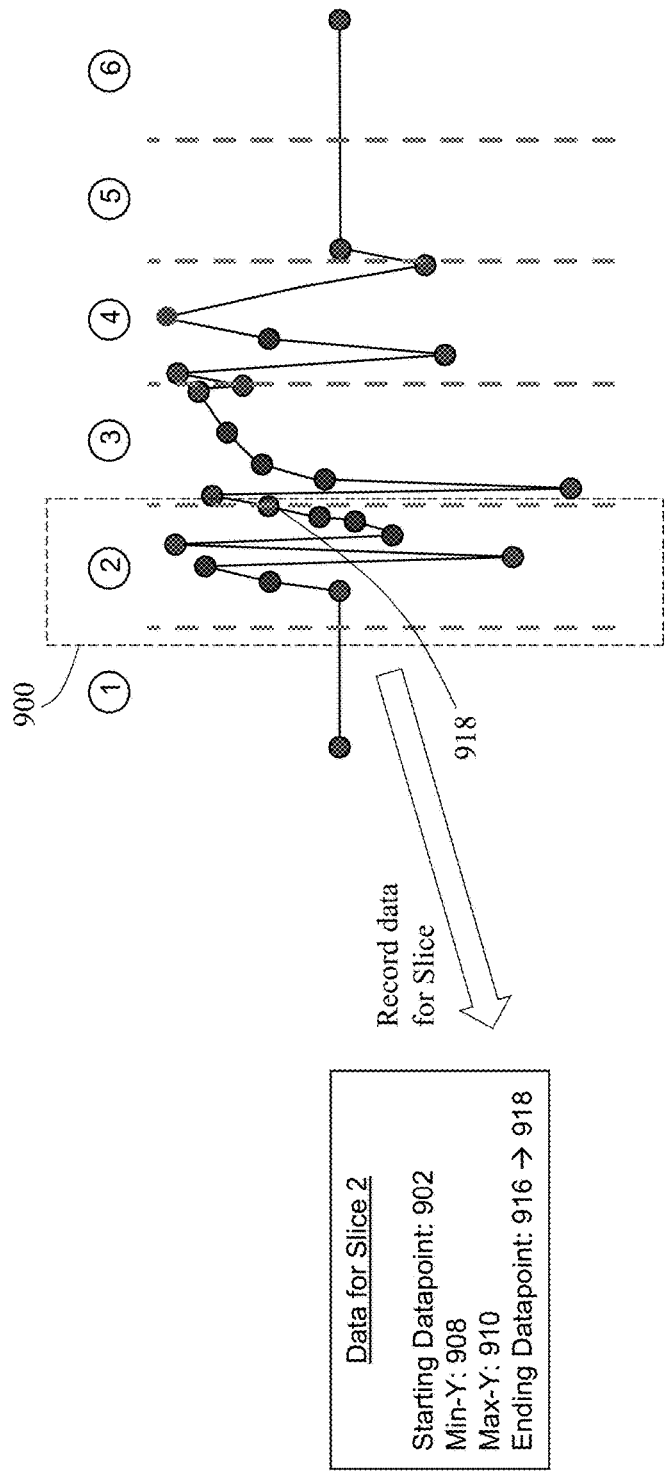
Figure 8T:
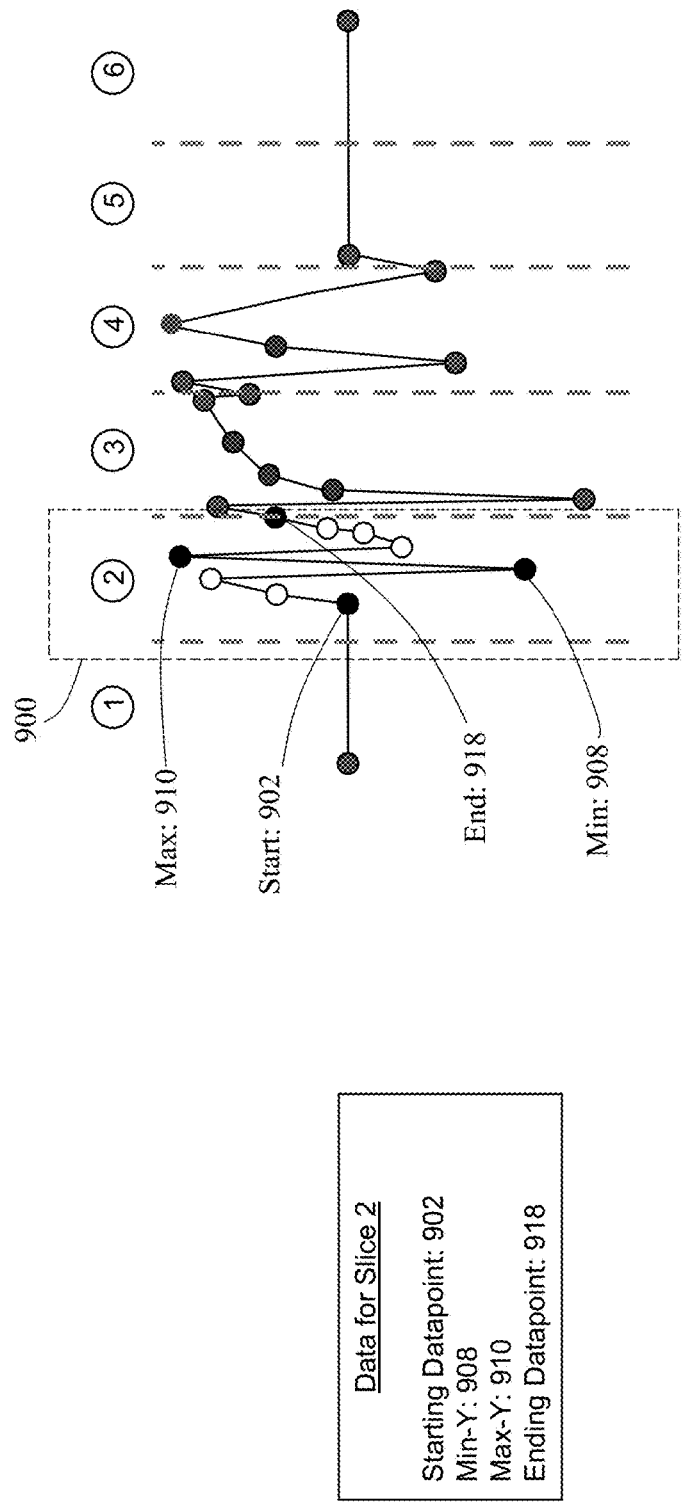

FIGS. 8A-T illustrate the processing that will; occur for slice number 2. In FIG. 8A, box 900 is drawn to represent the span of any datapoints having an X value which translates to the second slice.

As shown in FIG. 8B, datapoint 902 is selected for processing. In this situation, the X value of datapoint 902 translates to slice number 2. Therefore, as shown in FIG. 8C, this datapoint is recorded for each of the four categories for slice number 2 for (a) starting datapoint, (b) minimum Y datapoint, (c) maximum Y datapoint, and (d) ending datapoint.

As shown in FIG. 8D, the next datapoint 904 is selected for processing. In this situation, the X value of datapoint 902 translates to slice number 2. Therefore, a determination is now made whether this datapoint 904 has an X or Y value that would require an update to any of the categories which have already been recorded for slice number 2.

It can be seen that datapoint 904 has a higher Y value as compared to the datapoint 902 that was previously recorded for the maximum Y value. Therefore, as shown in FIG. 8E, datapoint 904 replaces datapoint 902 in the recorded category of the maximum Y datapoint.

In addition, since datapoint 904 is further along the X-axis as compared to datapoint 902 that was previously recorded as the last datapoint for the slice, then datapoint 904 also replaces datapoint 902 for this category as well.

As shown in FIG. 8F, the next datapoint 906 is selected for processing. In this situation, the X value of datapoint 904 translates to slice number 2. Therefore, a determination is now made whether this datapoint 906 has an X or Y value that would require an update to any of the categories which have already been recorded for slice number 2. Here, the datapoint establishes a new maximum Y value as compared to any of the previous datapoints for slice number 2. Therefore, as shown in FIG. 8G, datapoint 906 will be recorded as the new maximum Y datapoint. In addition, since datapoint 906 is further along the X-axis as compared to any previous datapoint for slice number 2, this means that datapoint 906 also replaces the previously recorded datapoint for this category as well.

As shown in FIG. 8H, the next datapoint 908 is selected for processing. In this situation, the X value of datapoint 908 also translates to slice number 2. Therefore, a determination is made whether this datapoint 908 has an X or Y value that would require an update to any of the categories which have already been recorded for slice number 2. Here, the datapoint establishes a new minimum Y value as compared to any of the previous datapoints for slice number 2. Therefore, as shown in FIG. 8I, datapoint 908 will be recorded as the new minimum Y datapoint. In addition, since datapoint 908 is further along the X-axis as compared to any previous datapoint for slice number 2, this means that datapoint 909 also replaces the previously recorded datapoint for this category as well.

As shown in FIG. 8J, the next datapoint 910 is selected for processing. In this situation, the X value of datapoint 910 also translates to slice number 2. A determination is made whether this datapoint has an X or Y value that would require an update to any of the categories which have already been recorded for slice number 2. Here, the datapoint establishes a new maximum Y value as compared to any of the previous datapoints for slice number 2. Therefore, as shown in FIG. 8K, datapoint 910 will be recorded as the new maximum Y datapoint. In addition, since datapoint 910 is further along the X-axis as compared to any previous datapoint for slice number 2, this means that datapoint 910 also replaces the previously recorded datapoint for this category as well.

As shown in FIG. 8L, the next datapoint 912 is selected for processing, where the X value of datapoint 912 translates to slice number 2. A determination is made whether this datapoint has an X or Y value that would require an update to any of the categories which have already been recorded for slice number 2.

In this situation, the datapoint 912 does not have a Y value that is greater than the previous maximum Y datapoint, nor does it have a Y value that is less than the minimum Y datapoint. Therefore, this datapoint will not displace either the maximum Y datapoint or the minimum Y datapoint. However, as shown in FIG. 8M, since datapoint 912 is further along the X-axis as compared to any previous datapoint for slice number 2, this means that datapoint 912 will replace the previously recorded datapoint for this category.

In a similar manner, as shown in FIG. 8N, the next datapoint 914 is selected for processing in slice number 2, where this datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 8O, since datapoint 914 is further along the X-axis as compared to any previous datapoint for slice number 2, this means that datapoint 914 will replace the previously recorded datapoint for this category.

As shown in FIG. 8P, the next datapoint 916 is selected for processing. As before, this datapoint in slice number 2, and this datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 8Q, since datapoint 916 is further along the X-axis as compared to any previous datapoint for slice number 2, this means that datapoint 916 will replace the previously recorded datapoint for this category.

As shown in FIG. 8R, the next datapoint 918 is selected for processing. One again, this datapoint in slice number 2, where the datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 8S, since datapoint 916 is further along the X-axis as compared to any previous datapoint for slice number 2, this means that datapoint 916 will replace the previously recorded datapoint for this category.

At this point, the last datapoint in slice number 2 has now been reached. Therefore, as shown in FIG. 8T, the datapoints for each of the four categories have now been recorded for slice number 2. For this slice, the starting datapoint is recorded as datapoint 902, the minimum Y datapoint is recorded as datapoint 908, the maximum Y datapoint is recorded as datapoint 910, and the ending datapoint is recorded as datapoint 918. The filtered dataset now only needs to include these four datapoints 902, 908, 910, and 918. All other datapoints within this slice can now be removed from the filtered dataset. In this case, datapoints 904, 906, 912, 914, and 916 can be removed from the filtered dataset. This means that a reduction of 55% has been achieved from data slice number 2 (5 removed datapoints/9 original datapoints in slice).

Figure 9:
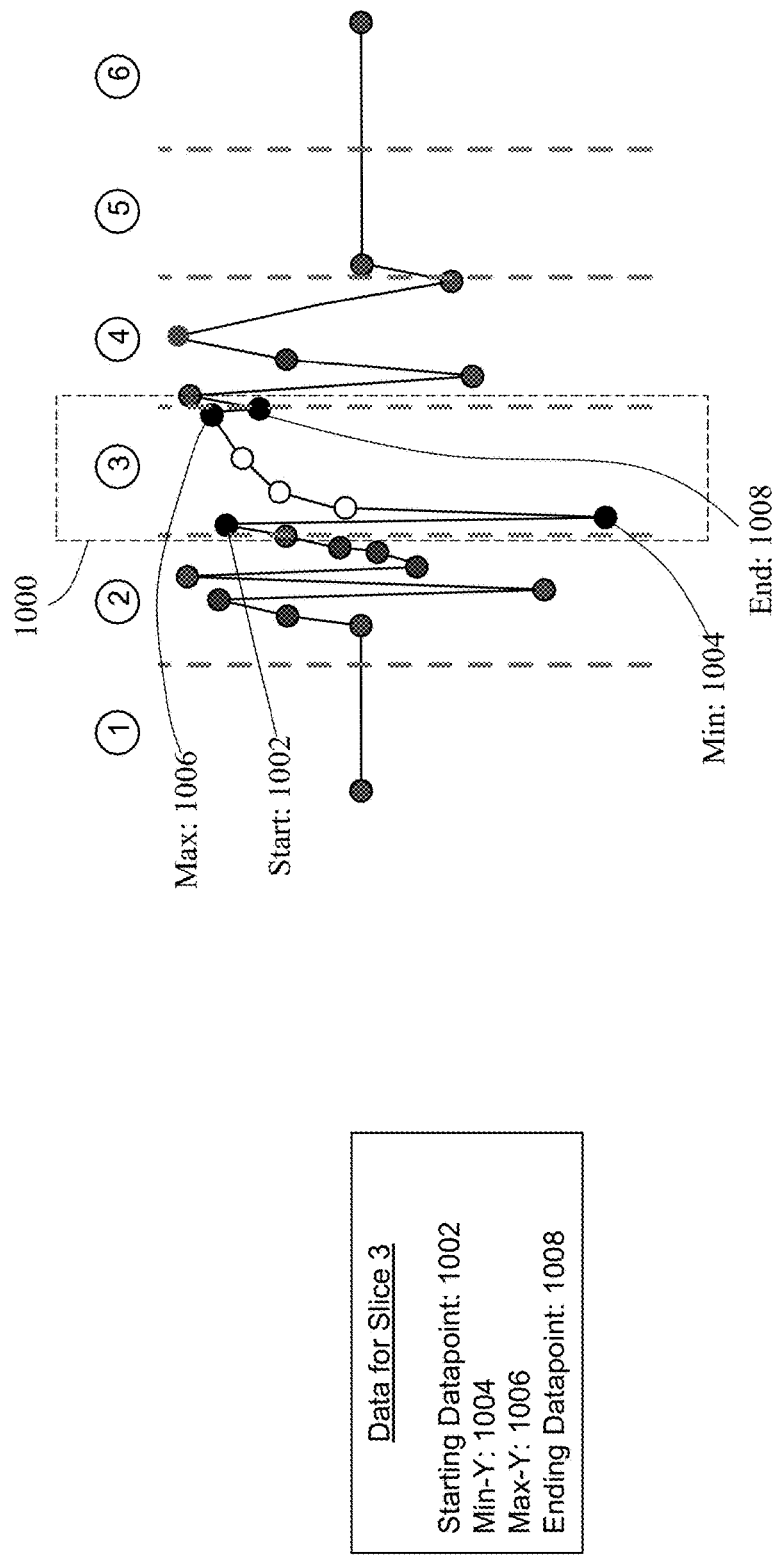

FIG. 9 illustrates this process performed against the datapoints in slice number 3. Here, the starting datapoint is recorded as datapoint 1002, the minimum Y datapoint is recorded as datapoint 1004, the maximum Y datapoint is recorded as datapoint 1006, and the ending datapoint is recorded as datapoint 1008. The filtered dataset now only needs to include these four datapoints, where all other datapoints within this slice can now be removed from the filtered dataset.

Figure 10:
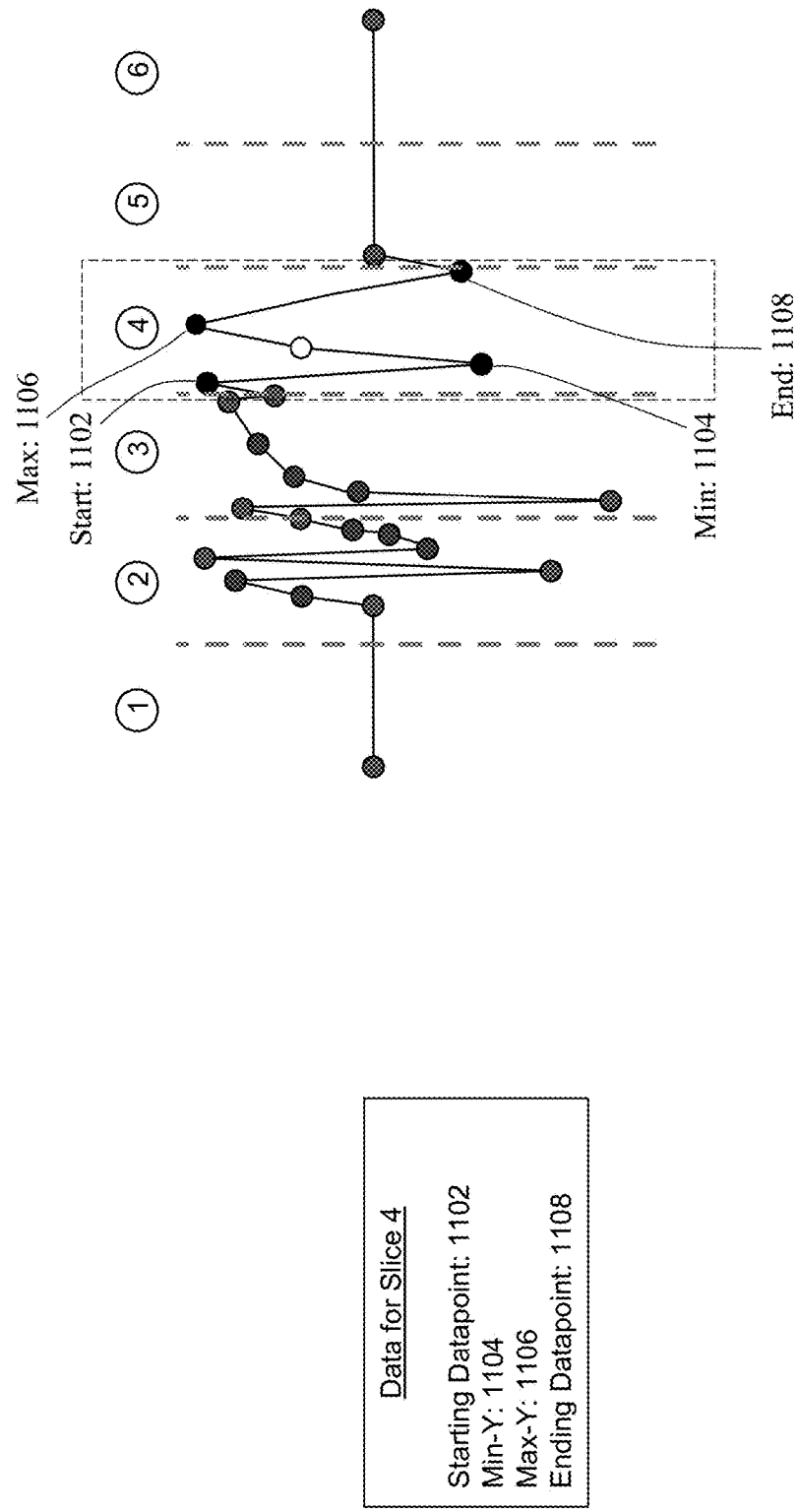

FIG. 10 illustrates this process performed against the datapoints in slice number 4. Here, the starting datapoint is recorded as datapoint 1102, the minimum Y datapoint is recorded as datapoint 1104, the maximum Y datapoint is recorded as datapoint 1106, and the ending datapoint is recorded as datapoint 1108. The filtered dataset now only needs to include these four datapoints, where all other datapoints within this slice can now be removed from the filtered dataset.

Figure 11:
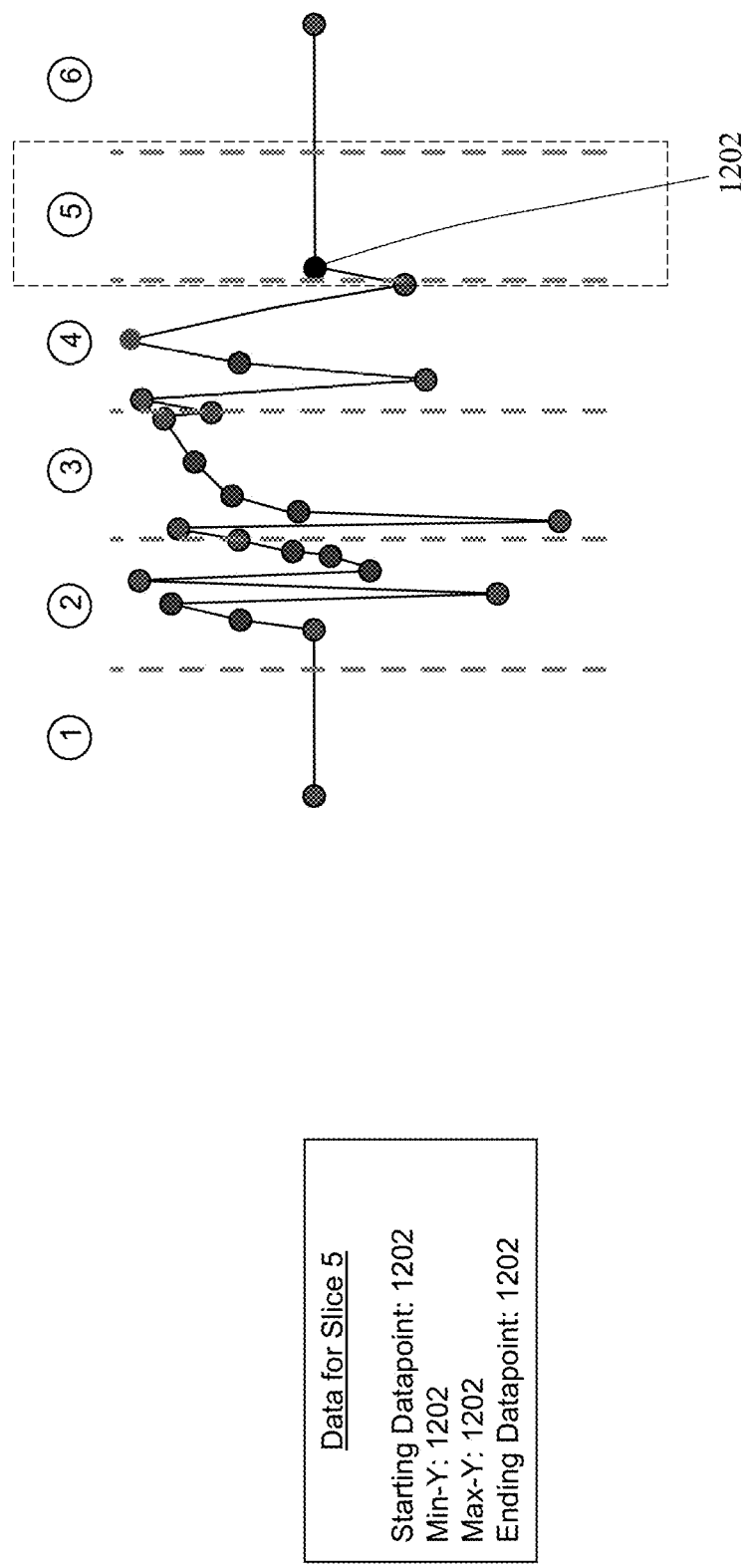

FIG. 11 illustrates this process performed against the datapoints in slice number 5. This slice only includes a single datapoint 1202. Therefore, datapoint 1202 is recorded for each of the four categories.

Figure 12:
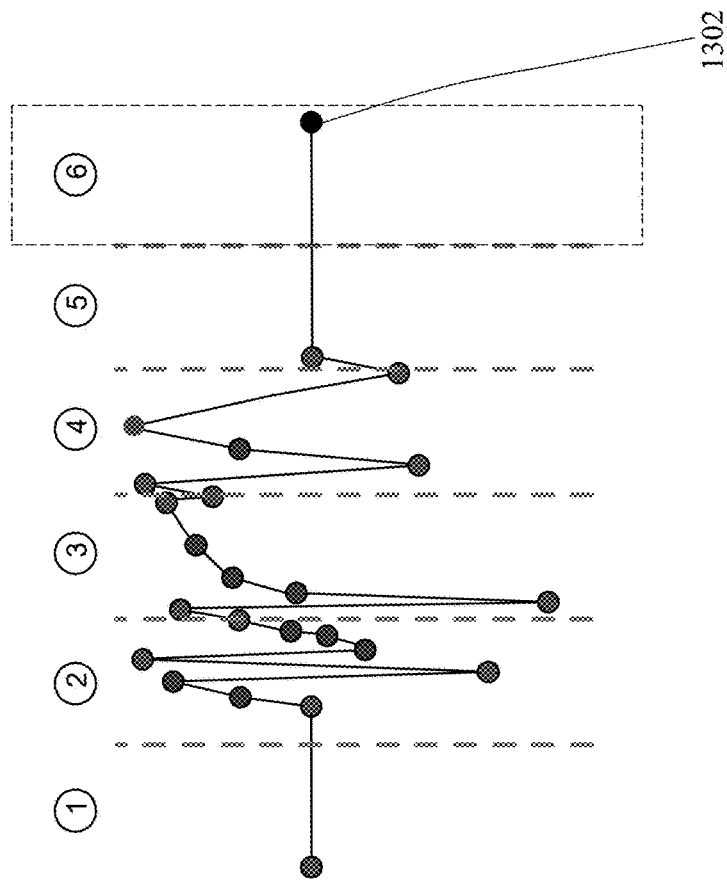

FIG. 12 illustrates this process performed against the datapoints in slice number 6. As before, this slice only includes a single datapoint 1302. Therefore, datapoint 1302 is recorded for each of the four categories.

Figure 13:
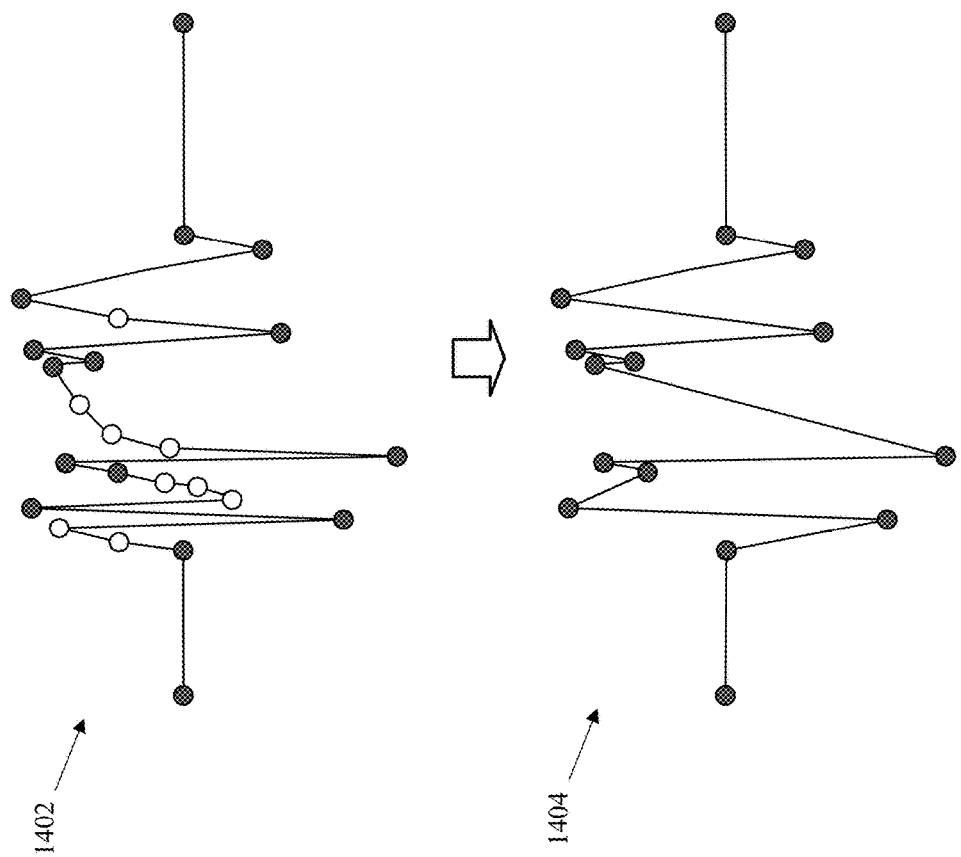

FIG. 13 illustrates the overall effects of the filtering for the entire waveform. Waveform 1402 represents the raw dataset having all of the original datapoints. The datapoints to be retained as shown as solid circles and the datapoints to be removed are shown as hollow circles. Waveform 1404 represents the filtered dataset with the filtered datapoints removed. As can be seen, this approach can significantly reduce the amount of data for waveforms, and hence reduce the amount of data that needs to be processed to render waveforms for display.

Further details regarding an example approach to perform data reduction can be found in co-pending U.S. application Ser. No. 14/981,488, filed on Dec. 15, 2015, which is hereby incorporated by reference in its entirety.

Therefore, what has been described is an improved method, system, and computer program product to provide fast access to waveform visualizations by performing data reduction of waveform data. The quantity of the waveform data is reduced in an intelligent manner, where the reduced waveform data still retains sufficient data fidelity for accurate data analysis and waveform visualization. The reduced data can then be displayed in an accelerated manner. From the display of the reduced data, this allows the user to select only the specific one or more waveforms for which the user seeks viewing of the full waveform data, e.g., for outliers from the simulation results.

System Architecture Overview

Figure 14:
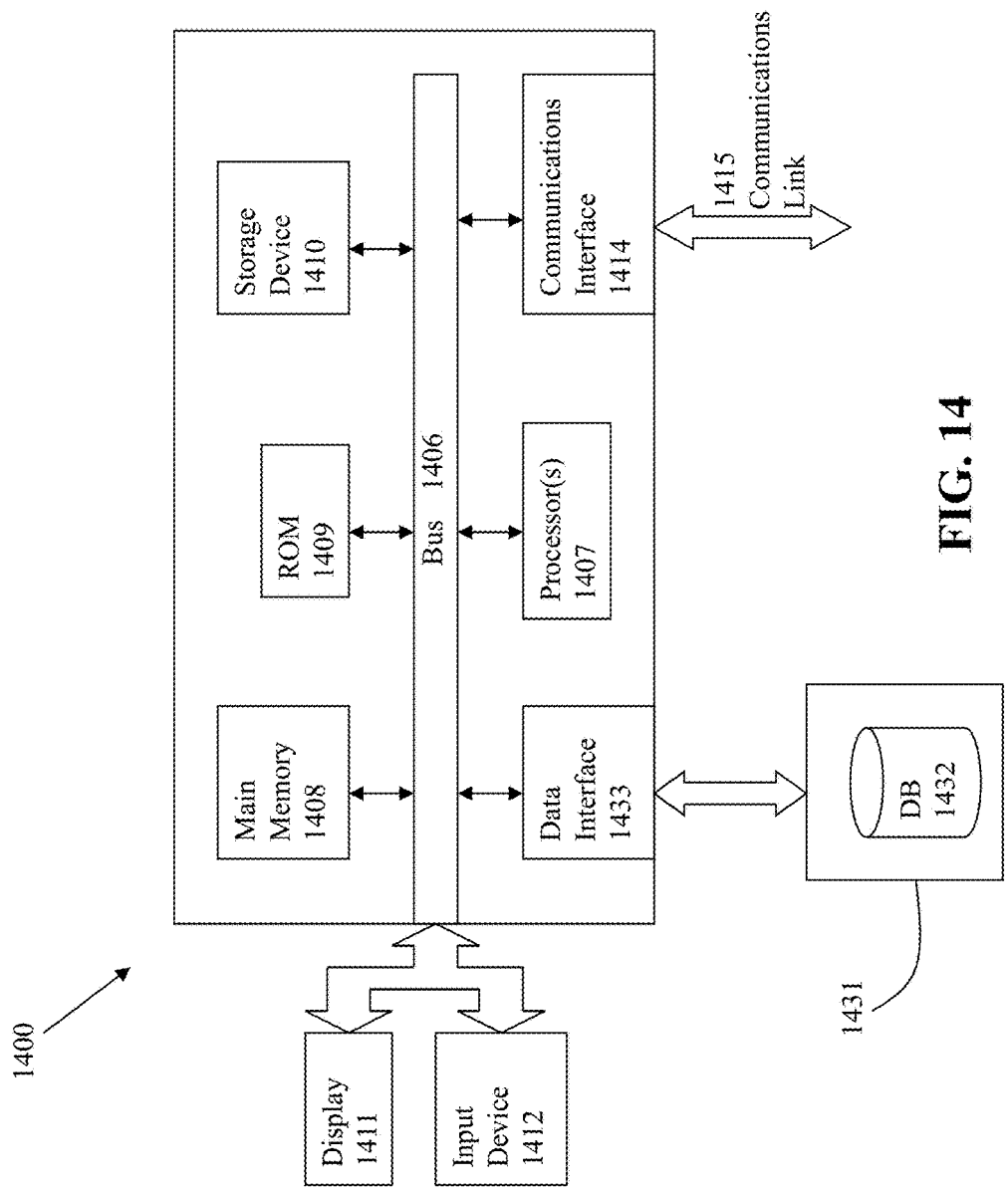
FIG. 14 depicts a computerized system on which some embodiments of the invention can be implemented.

FIG. 14 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor, comprising:
identifying an electrical circuit design to undergo simulation;
generating simulation results for the electrical circuit design that correspond to a data set;
performing data reduction by filtering the data set to generate a reduced data set, wherein the reduced data set comprises fewer datapoints than the data set;
generating a user interface to display waveform data on a display device corresponding to the simulation results;
providing an option within the user interface to an electronic design automation tool to generate a visual display of the reduced data set in place of the data set; and
displaying an interactive plot of the reduced data set in the user interface of the display device if the option is selected to display the reduced data set, the interactive plot of the reduced data set being rendered for display with decreasing display latency in place of the data set to reduce a volume of data processing by a graphics processing unit.

2. The method of claim 1, further comprising:
providing another option to the electronic design automation tool for selection of a specific signal within a visual representation of the reduced data set on the user interface of the display device; and
plotting the specific signal using the data set.

3. The method of claim 1, wherein the simulation results that correspond to the data set are generated by simulation runs distributed to multiple processing entities to generate a plurality of simulation results files.

4. The method of claim 3, wherein the data reduction is performed upon the plurality of simulation results files to generate a single file for the reduced data set.

5. The method of claim 1, wherein the simulation results are generated by processing entities within a cloud-based service.

6. The method of claim 1, wherein the data reduction is performed to retain data fidelity of the data set.

7. The method of claim 1, wherein the data reduction is performed by:
receiving waveform data corresponding to the simulation results;
dividing the waveform data into a plurality of slices;
identifying a starting datapoint, an ending datapoint, a maximum datapoint, and a minimum datapoint for at least some of the plurality of slices; and
filtering datapoints that do not correspond to the starting datapoint, the ending datapoint, the maximum datapoint, and the minimum datapoint from the waveform data to generate a filtered dataset.

8. A computer program product embodied on a non-transitory computer readable medium, the non-transitory computer readable medium having stored thereon a sequence of instructions which, when executed by a processor causes the processor to execute a method comprising:
identifying an electrical circuit design to undergo simulation;
generating simulation results for the electrical circuit design that correspond to a data set;
performing data reduction by filtering the data set to generate a reduced data set, wherein the reduced data set comprises fewer datapoints than the data set;
generating a user interface to display waveform data on a display device corresponding to the simulation results;
providing an option within the user interface to an electronic design automation tool to generate a visual display of the reduced data set in place of the data set; and
displaying an interactive plot of the reduced data set in the user interface of the display device if the option is selected to display the reduced data set, the interactive plot of the reduced data set being rendered for display with decreasing display latency in place of the data set to reduce a volume of data processing by a graphics processing unit.

9. The computer program product of claim 8, wherein the sequence of instructions, when executed by the processor, further causes the processor to execute:
provide another option to the electronic design automation tool for selection of a specific signal within a visual representation of the reduced data set on the user interface of the display device; and
plotting the specific signal using the data set.

10. The computer program product of claim 8, wherein the simulation results that correspond to the data set are generated by simulation runs distributed to multiple processing entities to generate a plurality of simulation results files.

11. The computer program product of claim 10, wherein the data reduction is performed upon the plurality of simulation results files to generate a single file for the reduced data set.

12. The computer program product of claim 8, wherein the simulation results are generated by processing entities within a cloud-based service.

13. The computer program product of claim 8, wherein the data reduction is performed to retain data fidelity of the data set.

14. The computer program product of claim 8, wherein the sequence of instructions, when executed by the processor, further causes the processor to perform the data reduction by:
receiving waveform data corresponding to the simulation results;
dividing the waveform data into a plurality of slices;
identifying a starting datapoint, an ending datapoint, a maximum datapoint, and a minimum datapoint for at least some of the plurality of slices; and
filtering datapoints that do not correspond to the starting datapoint, the ending datapoint, the maximum datapoint, and the minimum datapoint from the waveform data to generate a filtered dataset.

15. A system for analyzing a circuit design, comprising:
a processor;
a memory for holding programmable code; and
wherein the programmable code includes instructions for identifying an electrical circuit design to undergo simulation;
generating simulation results for the electrical circuit design that correspond to a data set;
performing data reduction by filtering the data set to generate a reduced data set, wherein the reduced data set comprises fewer datapoints than the data set;
generating a user interface to display waveform data on a display device corresponding to the simulation results;
providing an option within the user interface to an electronic design automation tool to generate a visual display of the reduced data set in place of the data set; and
displaying an interactive plot of the reduced data set in the user interface of the display device if the option is selected to display the reduced data set, the interactive plot of the reduced data set being rendered for display with decreasing display latency in place of the data set to reduce a volume of data processing by a graphics processing unit.

16. The system of claim 15, wherein the instructions, when executed by the processor, further causes the processor to execute:
providing another option to the electronic design automation tool for selection of a specific signal within a visual representation of the reduced data set on the user interface of the display device; and
plotting the specific signal using the data set.

17. The system of claim 15, wherein the simulation results that correspond to the data set are generated by simulation runs distributed to multiple processing entities to generate a plurality of simulation results files.

18. The system of claim 17, wherein the data reduction is performed upon the plurality of simulation results files to generate a single file for the reduced data set.

19. The system of claim 15, wherein the simulation results are generated by processing entities within a cloud-based service.

20. The system of claim 15, wherein the data reduction is performed to retain data fidelity of the data set.

21. The system of claim 15, wherein the instructions, when executed by the processor, further causes the processor to perform the data reduction by:
receiving waveform data corresponding to the simulation results;
dividing the waveform data into a plurality of slices;
identifying a starting datapoint, an ending datapoint, a maximum datapoint, and a minimum datapoint for at least some of the plurality of slices; and
filtering datapoints that do not correspond to the starting datapoint, the ending datapoint, the maximum datapoint, and the minimum datapoint from the waveform data to generate a filtered dataset.

\* \* \* \* \*